(12) United States Patent
Murakami et al.

(10) Patent No.: US 6,566,662 B1
(45) Date of Patent: May 20, 2003

(54) CHARGED BEAM EXPOSURE SYSTEM

(75) Inventors: Eiji Murakami, Kawasaki (JP); Shigehiro Hara, Kawasaki (JP); Hitoshi Higurashi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/343,508

(22) Filed: Jun. 30, 1999

(30) Foreign Application Priority Data

Jun. 30, 1998 (JP) .......................................... 10-199511

(51) Int. Cl.$^7$ .......................... H01J 37/00; H01J 37/30
(52) U.S. Cl. .............................. 250/492.1; 250/492.2; 250/492.21; 250/492.22; 250/398
(58) Field of Search ..................... 250/492.2, 492.22, 250/492.3, 492.1, 398

(56) References Cited

U.S. PATENT DOCUMENTS

| | | | | |
|---|---|---|---|---|
| 4,698,509 A | * | 10/1987 | Wells et al. .............. | 250/492.2 |
| 4,897,552 A | * | 1/1990 | Okunuki et al. .......... | 250/492.2 |
| 5,278,419 A | * | 1/1994 | Takahashi et al. ....... | 250/492.2 |
| 6,118,129 A | * | 9/2000 | Oae et al. ............... | 250/492.22 |

FOREIGN PATENT DOCUMENTS

| | | |
|---|---|---|
| JP | 1-152726 | 6/1989 |
| JP | 1-243520 | 9/1989 |
| JP | 2-5406 | 1/1990 |

* cited by examiner

*Primary Examiner*—John R. Lee
*Assistant Examiner*—David A. Vanore
(74) *Attorney, Agent, or Firm*—Oblon, Spivak, McClelland, Maier & Neustadt, P.C.

(57) ABSTRACT

A charged beam exposure system has a movable stage for supporting a specimen; a charged beam generator; a main deflector for deflecting the charged beam; a stage moving unit for moving the movable stage in a scanning direction; a pattern writing time calculation unit, and writing speed calculation unit and controller for performing pattern writing using the writing speed. For multi pass writing, a plurality of stripes cover one frame. The writing speed is obtained, for blocks which are partitioned into a fixed or arbitrary number of segments taking a pattern density within a frame (stripe) field.

9 Claims, 34 Drawing Sheets

CASE WHERE 2 FRAMES ARE RELATED TO A STRIPE

CASE WHERE 2 FRAMES ARE RELATED TO A STRIPE

CASE WHERE 2 FRAMES ARE RELATED TO A STRIPE

- SUB-FIELD ORIGINATING POINT
- SUB-FIELD ADDED TO SEGMENT 1
- SUB-FIELD ADDED TO SEGMENT 2
- SUB-FIELD ADDED TO SEGMENT 3
- SUB-FIELD ADDED TO SEGMENT 4

BLOCK EXTRACTION PROCESS

CHARGED BEAM EXPOSURE SYSTEM

BACKGROUND OF THE INVENTION

1. Field of the Invention

The present invention relates generally to a charged beam exposure system using electron beams etc for writing a pattern of a semiconductor integrated circuit such as an LSI etc on a sample such as a wafer and a mask at a high speed with a high accuracy, and more particularly to a charged beam pattern writing system contrived to enhance a throughput of the pattern writing by optimizing a stage speed.

2. Description of the Background Art

With scaling-up of a semiconductor device and as well fining of elements included therein, there widely spreads a pattern writing technology of writing a pattern on a wafer or mask by use of a charged beam exposure system.

In such a charged beam pattern writing technology, a range in which the charged beams can be deflected is limited, and the pattern is written by making the beams consecutively scan in an orthogonal direction (an X-direction) the reticle or the mask defined as a sample placed on the stage while deflecting the beams within a main deflection width (a Y-direction). Therefore, as shown in FIG. 33, for instance, a unit pattern writing area corresponding to a chip area is partitioned into frame fields F1–FN each defined by the main deflection beam deflection width. In FIG. 33, points P1–PN respectively denote frame originating points of the frame fields F1–FN. This type of pattern writing method is referred to as normal writing.

On the other hand, there has been carried out a pattern writing method of writing the same pattern a plurality of times while controlling a beam irradiation quantity of the charged beams for the purpose of enhancing a pattern dimensional accuracy, which is called a multi pattern writing. In the multi pattern writing, the pattern writing of a stripe field corresponding to a frame in the normal pattern writing, and a step movement is made in the direction (Y-direction) orthogonal to the stage moving direction. The above processes are repeated, thereby writing the pattern in all the stripe fields. This step movement corresponds to a width that is 1/number-of-multi-writings of a frame width.

FIG. 34 shows a concept of the multi-writings described above, wherein double writings are shown in this example, and the stripe field is shifted by half a width of the frame field. In this figure, Ps1–Psm denote stripe originating points of stripe field S1–SM and a main-deflection beam deflection width equals to a stripe field width. The main-deflection beam deflection width equals to the stripe field width.

Further, the frame or stripe field is, if the necessity may arise, subdivided into sub-deflection fields in which the beams can be deflected by a sub-deflection beam deflector.

In the charged beam pattern writing method explained above, a pattern writing speed is constant in the frame or stripe field. Further, a patten writing time (for writing a desired pattern by controlling a beam position and a beam configuration) defined in the frame or stripe field must be a value enough to follow up the stage speed when writing the pattern in the frame or stripe field.

The following methods have hither been proposed for determining the stage speed which might satisfy the above condition.

(i) A stage speed for executing a process of writing the pattern in the frame field, is determined based on a total number of shots embraced in the frame field and a total number of sub-deflection fields (refer to Japanese Patent Application Laid-Open Publication No.1-152726).

(ii) A stage speed for executing a process of writing the pattern in the frame field is determined based on a virtual number of shots which is obtained by dividing a total areal size of the pattern embraced in the frame field by an average areal size of one shot, and on a total number of sub-deflection fields (refer to Japanese Patent Application Laid-Open Publication No.1-243520).

(iii) The frame field is virtually partitioned into segments each having a predetermined length, a number of shots is calculated per partitioned segment, a pattern writing time in the segment having a maximum number of shots, and a value obtained by dividing this pattern writing time by the length of the segment is set as a stage speed for executing the process of writing the pattern in the frame field (refer to Japanese Patent Application Laid-Open Publication No.2-5406).

There arise, however, the problems inherent in the conventional speed determining methods.

According to the conventional methods (i), (ii), the average stage speed is determined based on such a premise that the patterns are uniformly disposed in the frame field. In an actual LSI device pattern, however, a pattern layout in the frame field is not uniform, and a pattern density is not uniform, wherein a high pattern density area and a low pattern density area alternately exist. Generally, a longer pattern writing time is needed for writing the pattern in the high pattern density area.

Hence, at the speeds calculated by the conventional methods (i) and (ii), a writing error (caused when the pattern writing process is unable to follow up the stage speed) does not occur in the pattern writing in the low pattern density area, but occurs in the high pattern density area. The problem is that the stage speed is decreased, and the pattern writing process in the concerned frame field must be again carried out.

On the other hand, according to the method (iii), the frame field is virtually partitioned into block segments, and the speed is determined for the block segment, thus considering the problem derived from the low pattern density, which remains unsolved by the conventional methods (i) and (ii). Resultantly, however, the method (iii) is no better than obtaining the average speed in the block regions.

For example, as shown in FIG. 36, the frame is partitioned into five blocks each having a width W, thus virtually defining the blocks. Assuming an example in which a high pattern density region A extend to some parts of both of the blocks 3, 4, according to the method (iii), it follows that the pattern is written in the block at the stage speed (V3=W/T) determined in the block 3.

However, though this speed V3 is optimal to only the block 3 in terms of the pattern writing, actually the pattern writing is effected consecutively in the block 3 and the block 4. Therefore, a stage speed optimal the pattern writing in the region A extending to both of the blocks 3, 4 is given by V34=W/2T. Accordingly, there might be a possibility in which the error occurs in the pattern writing because of the pattern writing process being unable to follow up the stage movement in terms of the relationship of V3>V34. Hence, the problem is that the stage speed is decreased as in the case of the methods (i), (ii), and the pattern writing process must be re-executed.

Moreover, the stage speed in the stripe field in the multi pattern writings, on the occasion of determining it, can be calculated by the conventional methods (i), (ii), (iii).

However, for instance, as shown in FIG. 37, a chip composed of five frame fields F1–F5 undergoes the multi pattern writings of which the number is 4, with the result that the number of stripe fields is 23 given in the following formula.

Number-of-stripe-fields=number-of-frame-fields+(number-of-multi-pattern-writings−1)×(frame field+1)

Therefore, in this case, the process is executed for all the stripe fields (23 fields), wherein the number of writings is over N-times as large as the normal writings.

As described above, when writing the pattern at the stage speed obtained by the conventional methods, there might be a possibility in which the error occurs in the pattern writing. Further, a stage speed calculation processing time that is over N-times as large as the time in the normal writing, is needed in the multi pattern writing effected N times. This leads to an increase in the pattern writing time, i.e., a decline of throughput of the whole exposure system.

SUMMARY OF THE INVENTION

Accordingly, it is a primary object of the present invention to provide a charged beam exposure system which is capable of determining a stage speed per frame field or stripe field a stage speed optimal enough to cause no error in pattern writing in consideration of a degree of pattern density in the frame field in normal pattern writing or in the stripe field in multi pattern writings, and also enhancing a throughput.

It is another object of the present invention to provide a charged beam exposure system which is capable of determining writing speed per stripe in the multi pattern writings optimal enough to cause no error in the pattern writing, and also calculating the stage speed at a high speed.

According to the present invention, each of blocks constituting a frame is partitioned into fixedly or arbitrarily determined segments, and a block pattern writing speed is determined based on a pattern writing time in this segment or a moving speed therein, and it is therefore feasible to enhance the throughput of the charged beam pattern writing apparatus by determining stage speed per frame field or stripe field which is optimal enough to cause no error in the pattern writing in consideration of the degree of pattern density in the frame field or the stripe field, and for the multi pattern writings, by high speed calculating the stage speed in a stripe field.

BRIEF DESCRIPTION OF THE DRAWINGS

In the attached drawings.

DETAILED DESCRIPTION OF THE PREFERRED EMBODIMENTS

Figure 1:
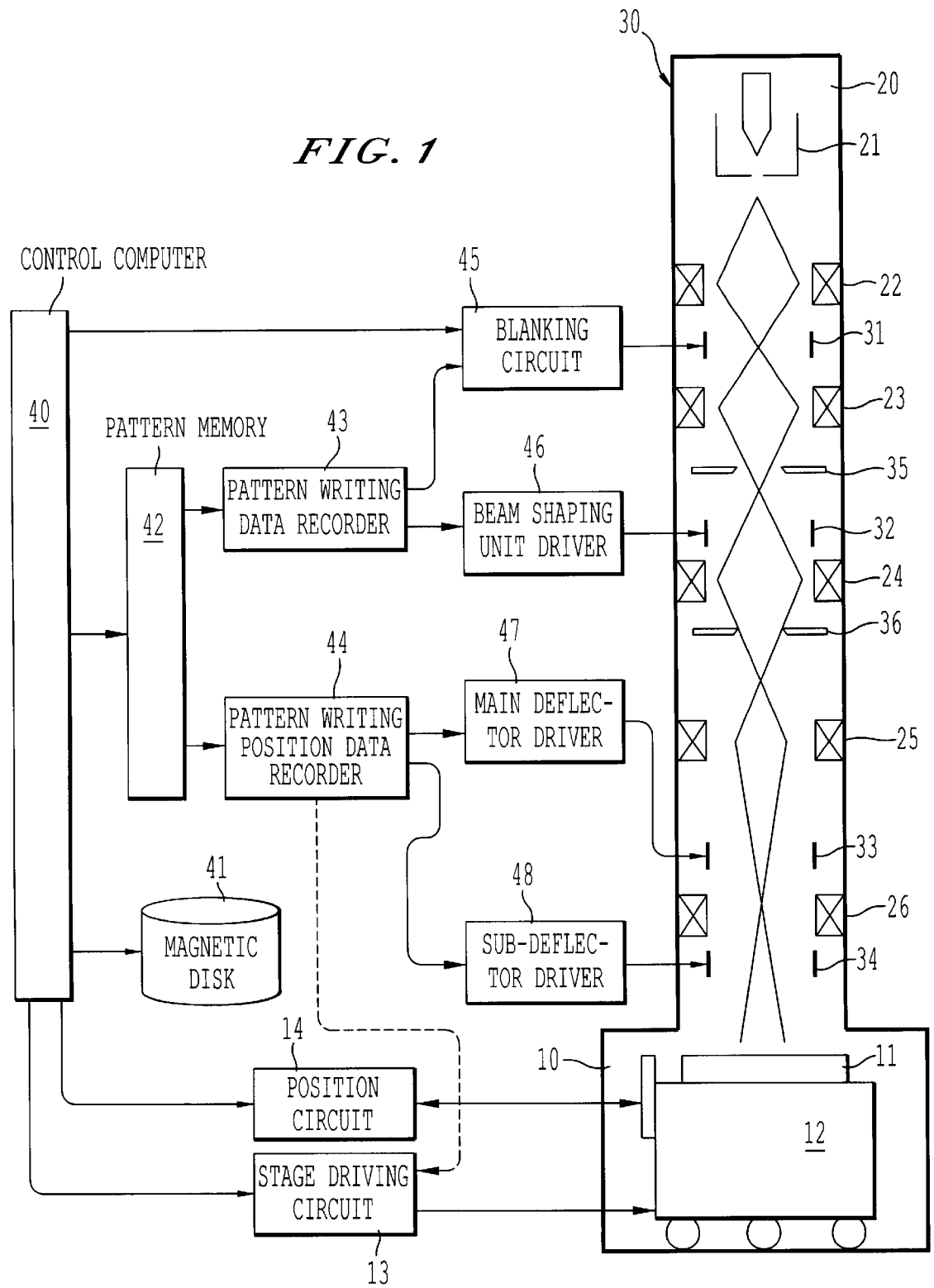
FIG. 1 is a schematic diagram showing a construction of an electron beam exposure system according to the present invention.

FIG. 1 is a block diagram schematically illustrating a configuration of an electron beam exposure system (EBES) according to the present invention in which an electron beam pattern writing is performed.

The electron beam exposure system includes an electron beam pattern writing apparatus 30, and an element for controlling the apparatus 30. A sample chamber 10 accommodates a stage 12 mounted with a sample 11 such as a semiconductor wafer or a mask etc. The stage 12 is moved in X-directions (right-and-left directions on the sheet surface) and Y-direction (up-and-down directions on the sheet surface) by a stage drive circuit 13. Then, a moving position of the stage 12 is measured by a position circuit 14 using a laser length measuring instrument etc. The stage drive circuit 13 and the position circuit 14 are controlled by a control computer 40, and a measured position output signal of the position circuit 14 is transmitted to a control circuit 40.

An electron beam optical system 20 is disposed upwardly of the sample chamber 10. The electron beam optical system 20 is constructed of an electron gun 21, lenses 22–26, a blanking deflector 31, a beam dimension variable deflector 32, a main-deflection beam deflector 33 for a beam scan, a sub-deflection beam deflector 34 for the beam scan, and beam shaping apertures 35, 36.

On the other hand, a storage device such as a magnetic disk device 41 etc is connected to the control computer 40, and is stored with LSI pattern writing data. The pattern writing data read out of the magnetic disk device 41 are temporarily stored per frame field (stripe field in the case of multi pattern writing) in a pattern memory (data buffer unit) 42. Frame data (stripe data) consisting of pattern writing data, i.e., a pattern writing position and pattern data (a pattern configuration, a pattern size) per frame (stripe) field, which are stored in the pattern memory 42, are analyzed by a pattern writing data analyzing unit constructed of a pattern writing data decoder 43 and a drawing position data decoder 44. Decoded data of the pattern writing data decoder 43 are transmitted to the blanking circuit 45 and a beam shaping unit driver 46. Decoded data of the pattern writing position data decoder 44 are transmitted to a main-deflector driver 47 and a sub-deflector driver 48. To be more specific, the pattern writing data decoder 43 performs a pattern partition about the pattern data defined as the frame (stripe) data on the beam-shapable shot basis through a combination of the beam shaping apertures 35, 36, and, based on this item of data, creates blanking data. The blanking data are transferred to the blanking circuit 45. Then, a further desired item of beam dimension data is created and transmitted to the beam shaping unit driver 46. Next, the beam shaping unit driver 46 transmits a predetermined deflection signal to the beam dimension variable deflector 32, thereby controlling a dimension of the electron beam.

Further, in the pattern writing position data decoder 44, data for positioning a sub-field is created based on the frame (stripe) data, and transmitted to the main-deflector driver 47. Then, the main-deflector driver 47 transmits a predetermined signal to the main-deflection beam defector 33 of the optical system, whereby the electron beam is deflected to scan a designated sub-field position. Further, the pattern writing position data decoder 44 generates a control signal for a sub-deflector scan, and transmits this signal to the sub-deflector driver 48. Subsequently, a predetermined sub-deflection signal is transmitted to the sub-deflection beam deflector 34 from the sub-deflector driver 48, thereby executing a pattern writing process per sub-field.

The pattern writing to be executed by the electron beam pattern writing apparatus involves positioning in a predetermined sub-deflection scan field (which is hereinafter simply called a sub-field) by the main-deflection beam deflector 33, performing shot-positioning within the sub-field by the sub-deflection beam deflector 34, controlling a beam configuration by the beam dimension variable deflector 32 in combination with the beam shaping apertures 35, 36, and executing the pattern writing process with respect to one of the frame fields (the stripe fields in the case of the multi pattern writing) into which the LSI chip is segmented in a rectangular shape corresponding to a deflection width of the main-deflection beam while consecutively moving the stage 12 in one direction. After finishing this pattern writing process, the stage 12 is moved stepwise in a direction orthogonal to the consecutive moving direction, and the process described above is repeated with respect to the next frame field (or the stripe field), and hereinafter the pattern is likewise sequentially written in a desired range.

Figure 2:
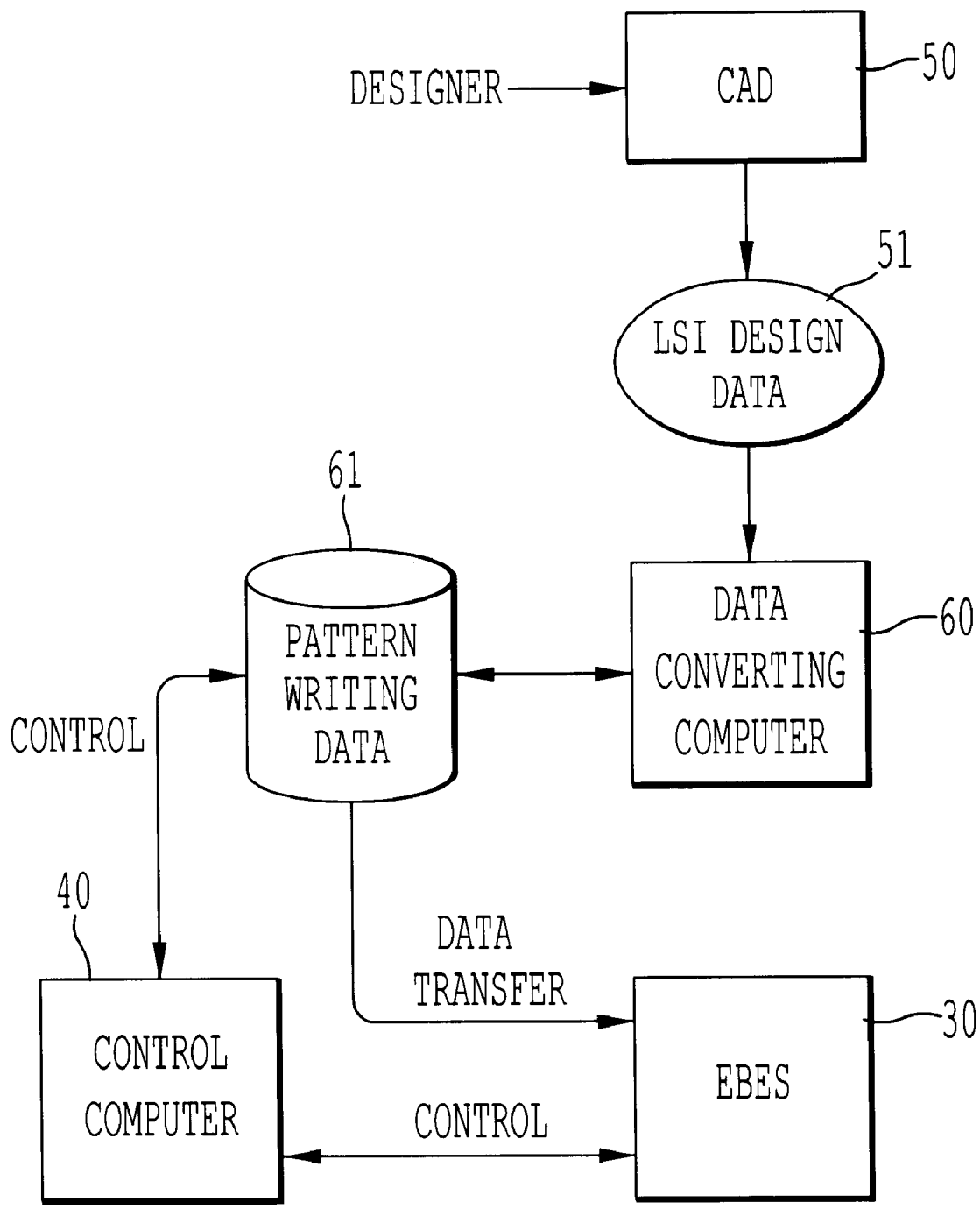
FIG. 2 is a schematic diagram showing a flow of data in the periphery of a pattern writing apparatus.

FIG. 2 is a schematic diagram showing a data flow in the data creating process for executing the LSI pattern writing process.

LSI design pattern data 51 is created by a CAD system 50 operated by a designer, and converted into pattern writing data 61 by a data converting computer 60. The pattern writing data 61 is transmitted to the electron beam pattern writing apparatus 30 on the basis of a command given from the control computer 40, wherein the electron beam pattern writing process is carried out.

Given herein is an explanation of the converting process executed by the data converting computer 60.

The LSI design pattern data created based on a logic design, a circuit design and a layout design must be converted into pattern writing data so that the pattern can be written by the exposure system. Namely, it is required that the design pattern data based on a multi-hierarchy cell structure be converted into a single-hierarchy cell structure for the pattern writing, data.

A variety of processes are executed on the occasion of the conversion into the single-hierarchy cell structure. The principal processes thereof are a process of eliminating an overlay of the pattern so as not to cause a decline of a pattern writing accuracy due to the multi-exposures relative to a pattern overlay, a process of performing a dimensional compensation for enlarging and reducing the design pattern data, and a process of partitioning a dimensionally compensated pattern into patterns (a rectangle, a trapezoid and a triangle etc) which can be written by the pattern writing apparatus.

The pattern writing data created through such processes and conversion are composed on a band-like frame field basis determined by a beam deflection width of the main-deflection beam deflector of the pattern writing apparatus. Then, a shot in the pattern writing apparatus is determined by reading the pattern writing data per frame field, and subdividing the pattern partitioned in the rectangle, the trapezoid etc, which may be conceived as an aggregation of beam shapable shots.

Figure 3:
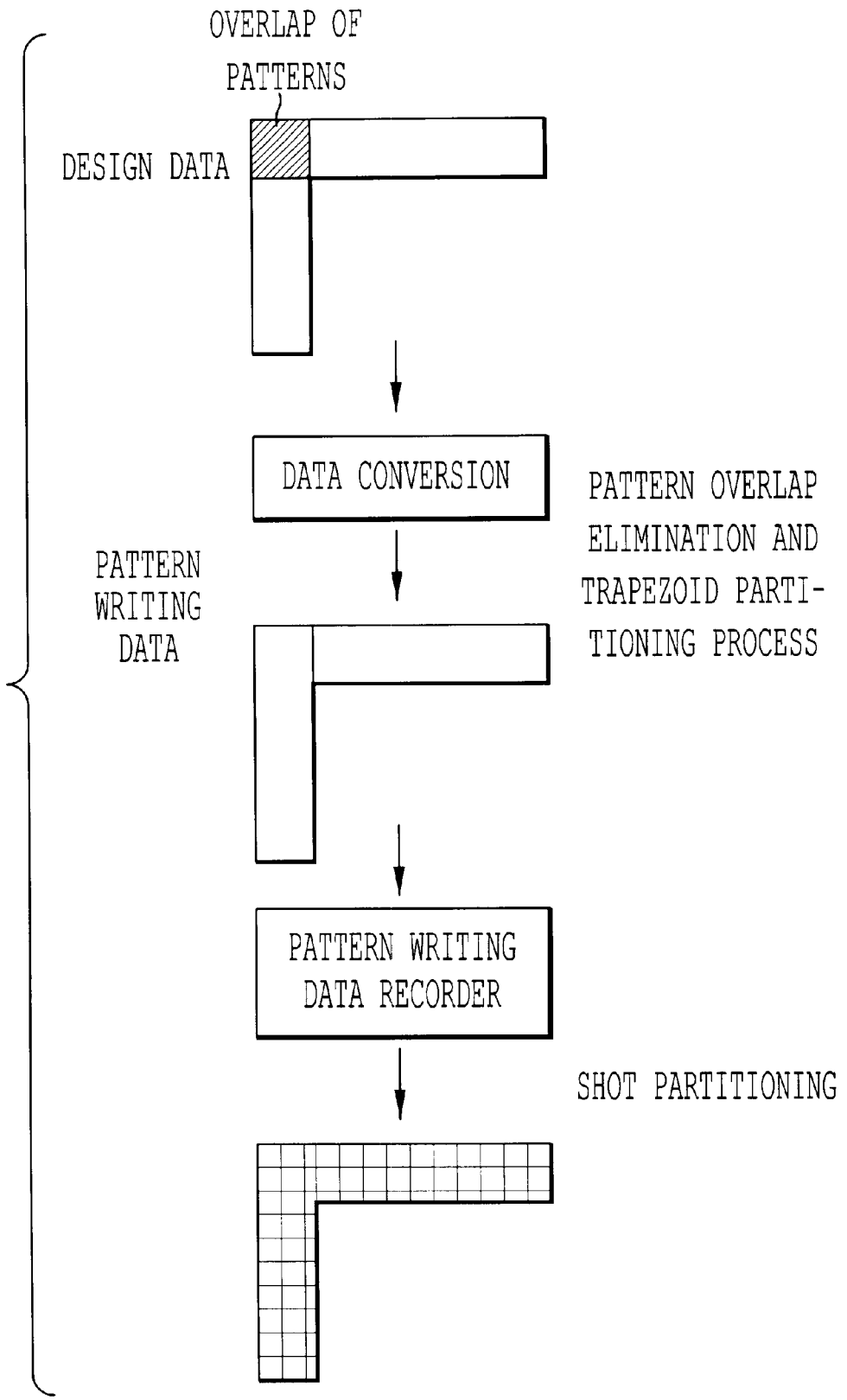
FIG. 3 is a diagram showing a process of generating pattern writing data.

FIG. 3 is a conceptual diagram showing the data conversion into the pattern writing data from the design data described above, wherein the process of eliminating the pattern overlap contained in the design data and the process or partition into the trapezoid (rectangle), are executed by way of the data conversion, and the pattern writing data decoder 43 executes a shot partitioning process thereon.

The pattern writing data obtained by such a data creating process are expressed in the pattern configuration, the position and the size as well, and defined as a set of pattern data based on the frame (stripe) field basis as well as on the sub-field basis. Then, the pattern data are stored in the above-described magnetic disk 41 shown in FIG. 1.

Some methods of the pattern writing using the charged beam exposure system according to the present invention in relation to a determination of a stage speed when in the pattern writing process, will be described with reference to the attached drawings.

(Method 1)

Figure 4:
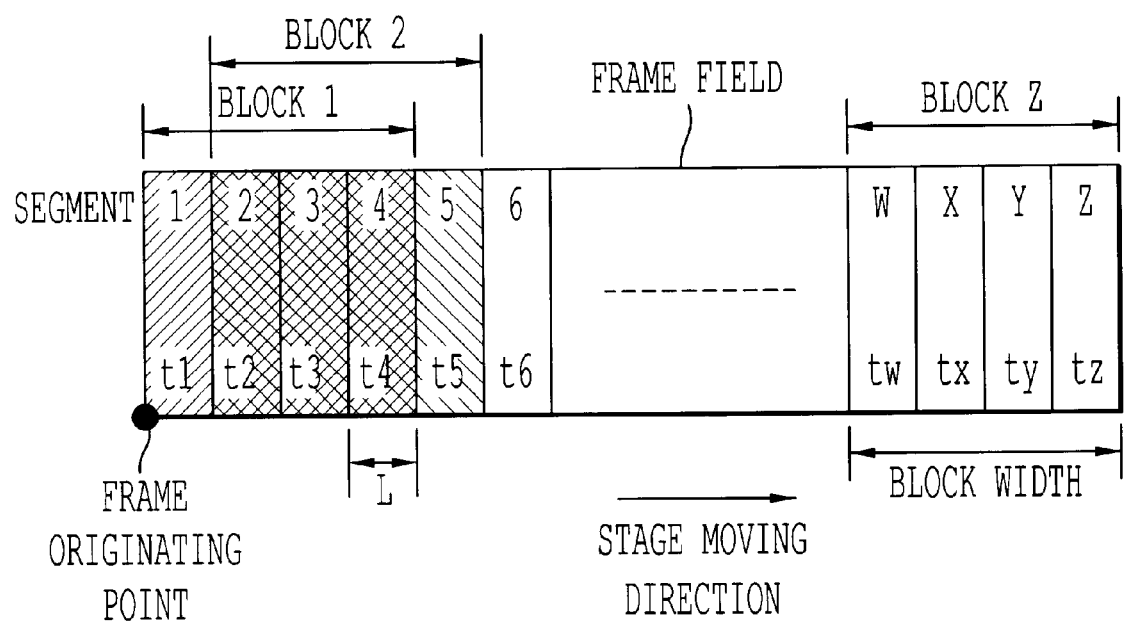
FIG. 4 is a diagram showing a relationship between a segment, a block and a frame in normal pattern writing.
Figure 5:
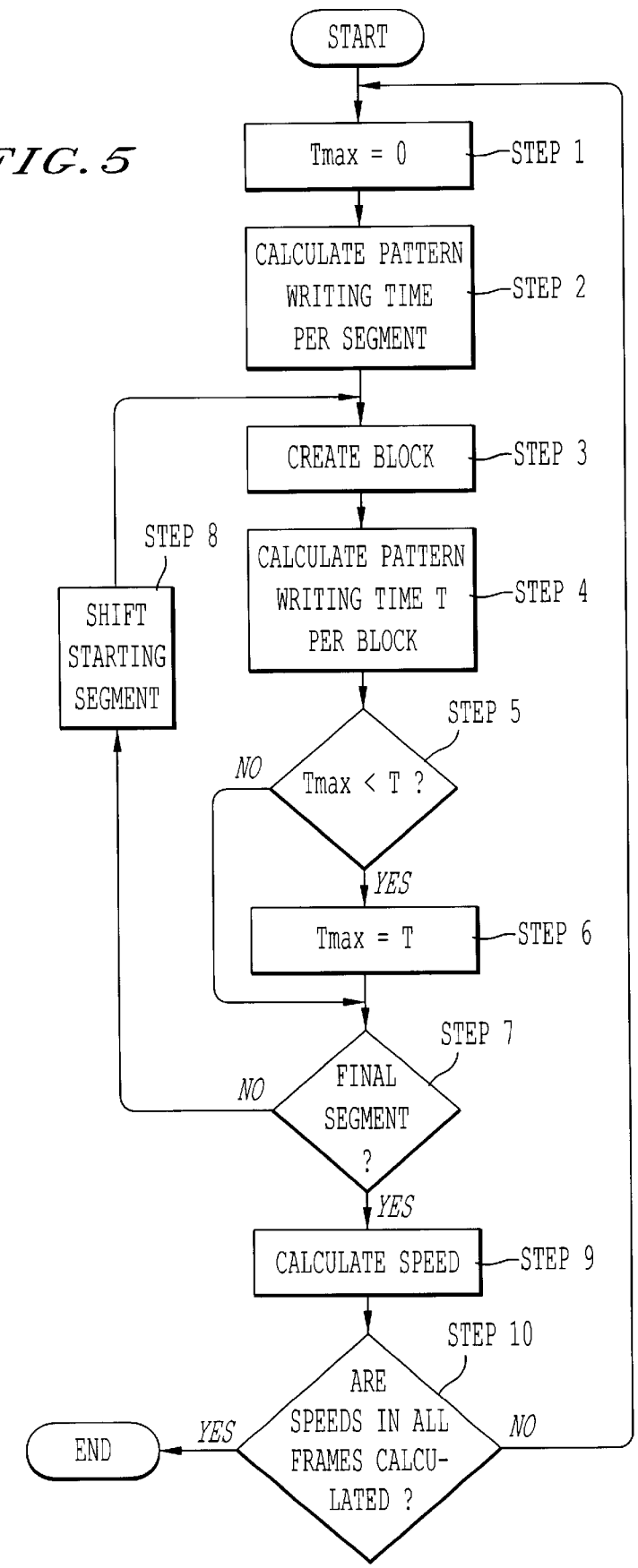
FIG. 5 is a flowchart showing a procedure of determining a speed in the normal pattern writing by adopting the segment having a predetermined width performed in an electron beam exposure system according to the present invention.

Method 1 will be described referring to a flowchart in FIG. 5, wherein a block is, as illustrated in FIG. 4, partitioned into segments each having a fixed width L, and a pattern writing time per block is obtained based on a pattern writing time in this segment.

To start with, a longest (maximum) pattern writing time (Tmax) per block basis in one frame field is set to an initial value (0) such as Tmax=0 (step 1).

Next, a pattern writing time (t1–tz) is obtained per segment (the segments 1–Z) having the predetermined width L from a frame originating point of the frame field (step 2). Note that the width of the final segment Z is not necessarily L.

Subsequently, a predetermined number of segments continuous from the starting segment are extracted based on a block basis (having a block width W), and a block is thus formed (step 3). A first block starts from a segment 1 including the frame originating point. For example, in the method 1, one block is composed of four segments. The block 1 is composed of the segment 1 including the frame originating point through the segment 4, and other blocks are composed in the same way. Note that the block width W is set as a beam deflection width of the main deflector.

Next, the pattern writing time is obtained per block created in step 3, and is set as a pattern writing time T of this block (step 4). For instance, in the method 1, a pattern writing time T1 of the block 1 is given by T1=t1+t2+t3+t4. A block 2 starts from the segment 2, and hence a pattern writing time of the block 2 is given such as T2=t2+t3+t4+t5=T1−t1+t5.

Thus, the pattern writing time of the block may be obtained whichever way, i.e., simply by adding the pattern writing times of the segments contained in this block, or by paying attention to a difference between the calculation target block and the block anterior thereto.

Next, the maximum pattern writing time Tmax in the processes effected so far is compared with the pattern writing time T obtained in step 4. If Tmax<T, the processing proceeds to next step 6 (step 5), wherein the pattern writing time T obtained in step 4 is set as the maximum pattern writing time Tmax in one frame. Note that the maximum pattern writing time Tmax in the block 1 is set in step 1 such as Tmax=0, and therefore the pattern writing time T in the block 1 automatically becomes Tmax (step 6).

It is judged in next step 7 whether or not the block reaches the final segment Z within the frame. Note that when judging in step 5 that Tmax≧T, the judgement is made in step 7.

If the final segment Z of the frame is not extracted on the block basis in step 7, the processing moves to step 8, wherein the starting segment is shifted, and the processes from step 3 to step 7 are repeated. In the case of the method 1, the starting segment is shifted one by one such as the segments 1, 2, 3 . . . each time the pattern writing time per block is calculated.

When the final segment Z is extracted in step 7, the processing proceeds to step 9, in which a speed is calculated. In this speed calculation, a speed Vmin (Vmin=W/Tmax) is obtained by dividing the block width W by the maximum pattern writing time Tmax among the pattern writing times for the respective blocks. The thus calculated speed Vmin is set as a stage speed at which the frame field undergoes the pattern writing process. A block width of the final block Z is not necessarily W.

The processes described above are executed for obtaining the maximum pattern writing time per frame in the pattern writing range and the speed corresponding thereto, and this calculation is performed for all the frames. It is judged in step 10 whether or not the speed is calculated with respect to all the frame fields. If there are remaining frame fields, the extraction starting segment is set to the segment 1 with respect to the next frame field. Then, the processes starting from step 1 are repeatedly implemented, and finished when the speed calculations are performed with respect to all the frames.

In the processes explained above, the pattern writing time T is obtained per block in step 4, and the maximum pattern writing time Tmax is set depending on the judgement in step 5. Another method is, however, that at first the pattern writing times T in the respective blocks are obtained and stored, and Tmax defined as the maximum value is obtained from the pattern writing times T in the respective blocks. A further method may be such that the speed V (V: W/T) per block is obtained using the block width W and the pattern writing time T per block, and the minimum speed is obtained from the speeds V in the respective blocks belonging to the frame and set as Vmin.

Figure 6:
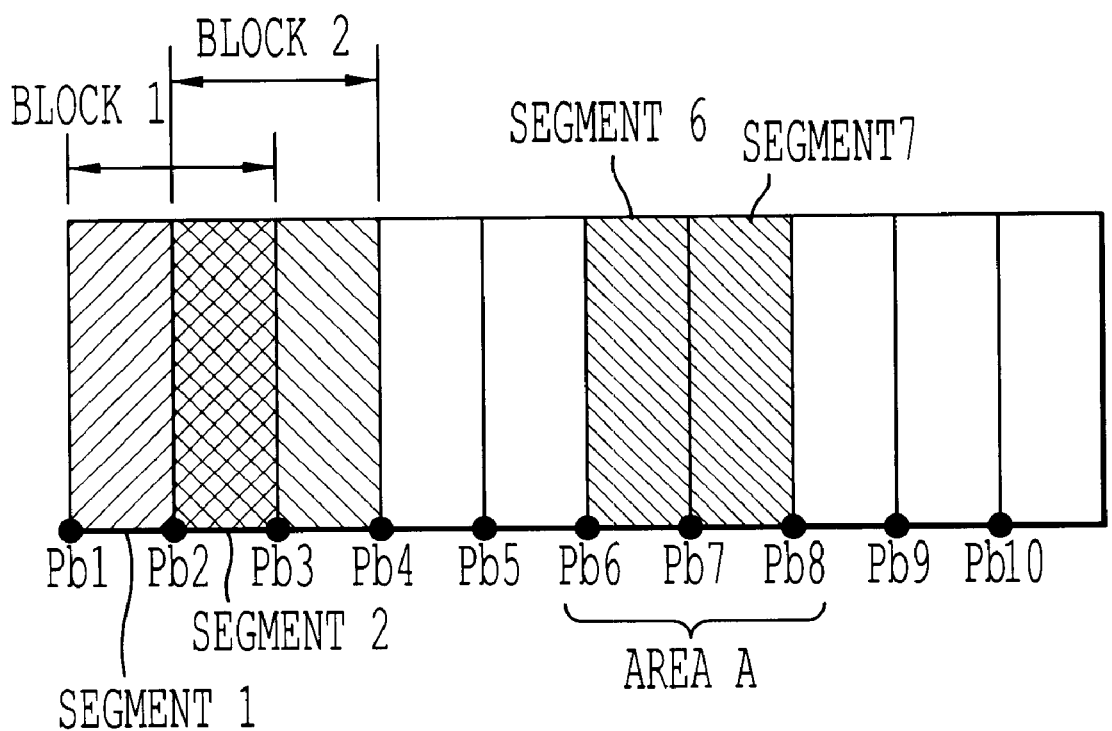
FIG. 6 is a diagram illustrating a relationship between the block and the segment, and how the problems peculiar to the prior art are solved.
Figure 36:
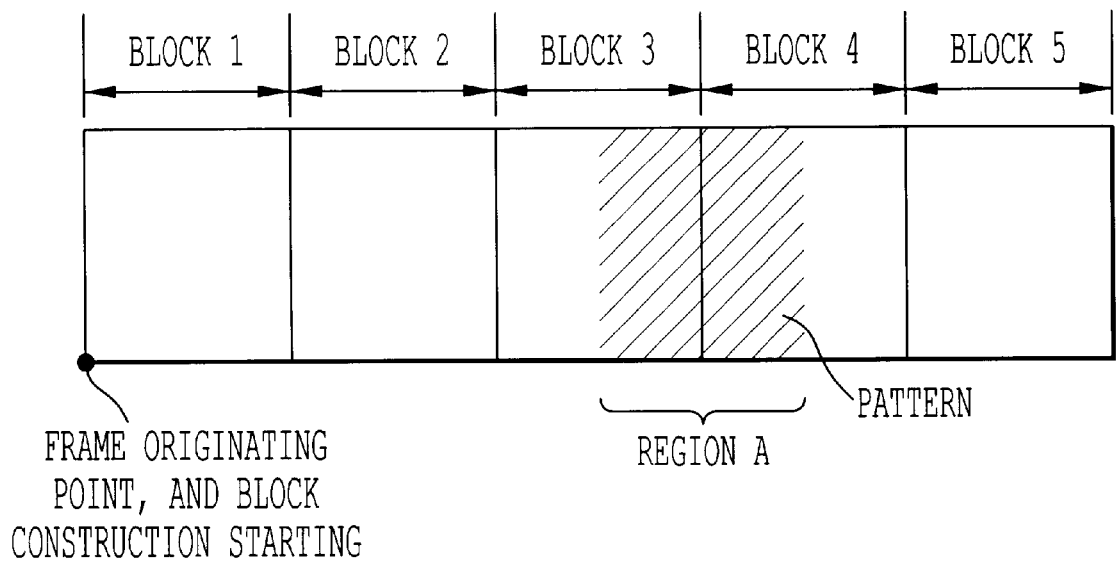
FIG. 36 is a diagram showing a problem inherent in the prior art normal pattern writing.

FIG. 6 is an explanatory diagram showing an effect exhibited in the present invention, and corresponds to FIG. 36. A high density region A extending over some areas of both of the blocks 3, 4, is partitioned into two segments 6, 7 in FIG. 6, wherein the speed is obtained for each segment. Accordingly, though there is no alternative but to write the pattern at a stage speed (V3=W/T) determined in the block 3 in FIG. 36, a pattern writing time in the block corresponding to region A is calculated based on the pattern writing time in the block 6 composed of the segments 6, 7, viz., this is given by V6 W/(T6+T7). Hence, it never happens that the pattern writing process can not follow up the stage movement, and that an error of the pattern writing occurs.

(Method 2)

Figure 7:
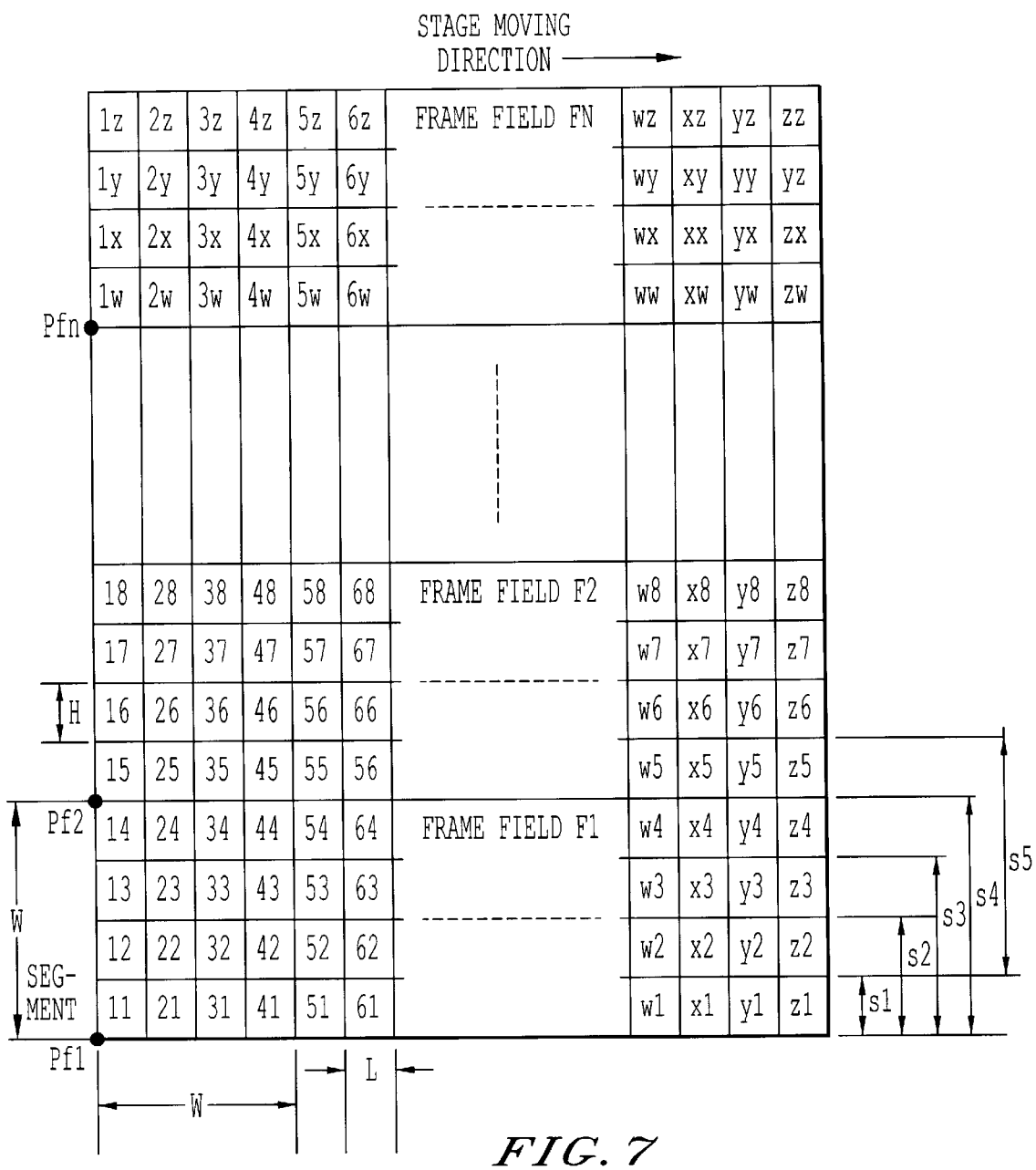
FIG. 7 is a diagram showing a relationship between the segment, the block, the frame and a stripe in multi pattern writings.
Figure 8:
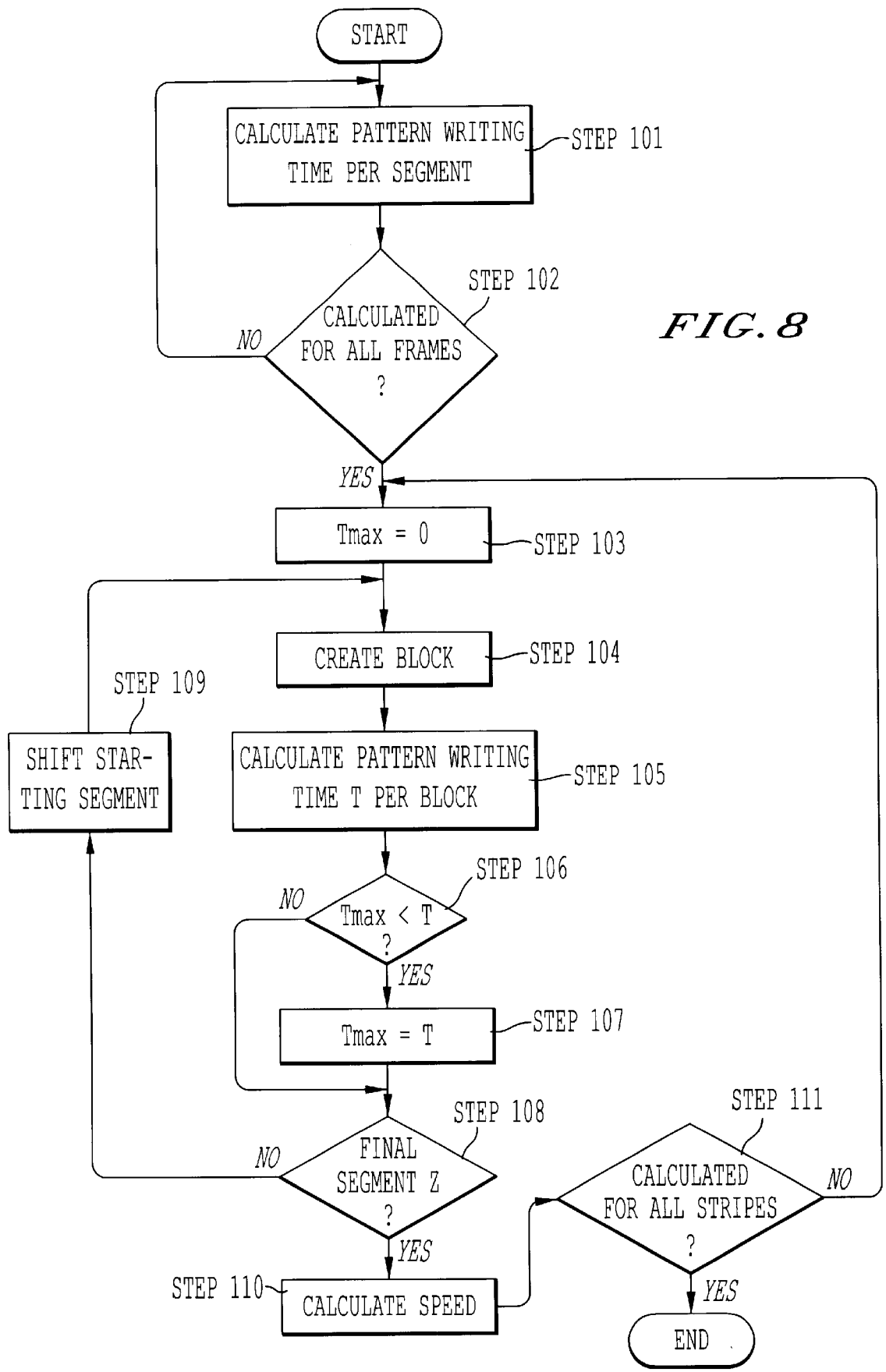
FIG. 8 is a flowchart showing a procedure of determining a speed in the multi pattern writings by adopting the segment having a predetermined width performed in an electron beam exposure system according to the present invention.

A method 2 is intended to determine a optimum value of the stage speed in the multi pattern writing, and explained referring to FIGS. 7 and 8.

The multi pattern writing is that the pattern writing is, as shown in FIG. 7, covered with frame fields F1–FN, each frame field is partitioned by four strips each having a height H, and the block constituting the frame is partitioned into four strips each having a width L, thus forming segments. In the drawings hereinafter, Pf1–Pfn respectively denote frame originating points of Frame Fields F1–FN and s denotes a stripe field.

Referring to FIG. 7, a leftmost lowermost point Pf1 is set as a frame originating point of the frame field 1, a segment containing this frame originating point is set as 11 and other segments sequenced in the X-direction are set such as 21, 31 . . . y1, z1 and in the Y-direction such as 12, 13 . . . 1y, 1z in matrix on the whole, thus giving the reference numeric symbols to the segments. Note that the width of the segment becoming the final segment z* in the stage moving direction is not necessarily L, and the height of the segment becoming the final segment *z in the direction orthogonal to the stage moving direction in the final frame field is not necessarily H.

A procedure of determining the optimum value of the stage speed will hereinafter be explained with reference to a flowchart in FIG. 8.

To start with, a pattern writing time (t11–tzz) is obtained for each of the segments 11–zz (step 101).

Next, it is judged whether or not the pattern writing time per segment is calculated with respect to all the frame fields, and, if there are remaining frame fields, the process in step 101 is repeatedly effected for the next frame field (step 102). After finishing the process in step 101 with respect to all the frame fields, the processing proceeds to next step 103.

In next step 103, the longest (maximum) pattern writing time (Tmax) per block basis in one frame field is set to the initial value (0) such as Tmax=0.

Subsequently, a predetermined number of segments continuous from the starting segment are extracted for a field corresponding to the stripe field (starting from the stripe field S1), and a block is thus formed (step 104).

A height of this block is not W up to the stripe field of which a serial number is the same as the number of the multi pattern writings (e.g., if. the number of the multi pattern writings is 4, this implies the stripe field 4). Therefore, the starting segment is set to the segment 11, and the block height is obtained in such a way that a divided result of W by the number (e.g., 4) of the multi pattern writings is multiplied by the stripe field number (e.g., 3), i.e., the block height is given by (W/4)×3.

Note that the block width W and the block height W are each set to a beam deflection width of the main deflector in this method. Further, the segment containing the frame originating point of the frame field 1 is set to the segment 11, and the starting segment of the block 1 in the stripe field 1 is set to the segment 11.

Next, the pattern writing time is obtained for the created block, and is set as the pattern writing time T of this block (step 105).

The block-basis pattern writing time of each stripe in FIG. 7 is given as follows.

A pattern writing time Ts11 of the block 1 (from the starting segment 11) in the stripe field 1 is calculated such as t11+t21+t31+t41.

A pattern writing time Ts12 of the block 2 (from the starting segment 21) in the stripe field 1 is calculated such as Ts11−t11+t51.

A pattern writing time Ts21 of the block 1 (from the starting segment 11) in the stripe field 2 is calculated such as Ts11+t12+t22+t32+t42.

A pattern writing time Ts22 of the block 2 (from the starting segment 21) in the stripe field 2 is calculated such as Ts12+t22+t32+t42+t52.

A pattern writing time Ts31 of the block 1 (from the starting segment 11) in the stripe field 3 is calculated such as Ts21+t13+t23+t33+t43.

A pattern writing time Ts32 of the block 2 (from the starting segment 21) in the stripe field 3 is calculated such as Ts22+t23+t33+t43+t53.

A pattern writing time Ts41 of the block 1 (from the starting segment 11) in the stripe field 4 is calculated such as Ts31+t14+t24+t34+t44.

A pattern writing time Ts42 of the block 2 (from the starting segment 21) in the stripe field 4 is calculated such as Ts32+t24+t34+t44+t45.

A pattern writing time Ts51 of the block 1 (from the starting segment 12) in the stripe field 5 is calculated such as Ts41−t11−t21−t31−t41+t15+t25+t35+t45.

A pattern writing time Ts52 of the block 2 (from the starting segment 22) in the stripe field 5 is calculated such as Ts42−t21−t31−t41−t51+t25+t35+t45+t55.

It is to be noted that the pattern writing time per block is calculated by paying attention to the difference from the same block in the stripe field anterior to the calculation target block, however, this may be obtained simply by adding the pattern writing times in the segments. Take the block 2 in the stripe field 5 for instance, the pattern writing time Ts52 may be obtained such as Ts52=t22+t32+t42+t23+ t33+t43+t53+t24+t34+t44+t54+t25+t35+t45+t55.

Next, the maximum pattern writing time Tmax in one stripe field is compared with the pattern writing time T obtained in step 105. If Tmax<T, the pattern writing time T obtained in step 104 is set as the maximum pattern writing time Tmax in one frame (step 107).

Next, it is confirmed whether or not the final segment z* in the stripe field in the stage moving direction is extracted on the block basis (step 108). Incidentally, when Tmax≧T in step 106, the process in step 108 is likewise executed.

If the last segment is not extracted, the starting segment extracted on the block basis is shifted (step 109), and the processes from step 104 to step 108 are repeated.

For instance, in the example shown in FIG. 7, the starting segment is shifted one by one in the stage moving direction such as the segments 11, 21, 31 . . .

When the final segment z* is extracted in step 108, a minimum speed is calculated (step 110). More specifically, the speed Vmin is obtained by dividing the block width W by the maximum time Tmax among the pattern writing times for the respective block (Vmin=W/Tmax). The thus calculated speed Vmin is set as a stage speed at which the pattern writing process in the stripe field is executed. Note that the block width W of the final block is not necessarily W.

Next, it is judged whether or not the speed calculation is done for all the stripe fields and, if there are remaining stripe fields, the extraction starting segment is shifted to a segment containing a stripe originating point with respect to the next stripe field, and the processes from step 103 to step 110 are repeatedly executed. Note that the starting segment begins, as explained above, from the segment 11 up to the stripe field, of which the serial number is the same as the number of the multi pattern writings among the first series of stripe fields.

In the processes effected so far, the pattern writing time T is obtained per block in step 105, and the maximum pattern writing time Tmax is set depending on the judgement in step 106. Another method is, however, that at first the pattern writing time T per block is obtained, and the maximum value Tmax among the pattern writing times T for the respective blocks is obtained just before the above process.

Further, the speed V of this block is obtained per block from the block width W and the pattern writing time T (V: W/T), and the minimum speed among the speeds V for the respective blocks is obtained and may be set as Vmin.

An effect of calculating the optimum value of the stage speed in the multi pattern writings described above, will be explained with reference to FIG. 37.

According to the prior art, the number of the stripe fields is, as described above, 23, it followed that the processing is executed for all the stripe fields (23 fields), and there was the necessity for executing the processes for calculating the pattern writing times corresponding to the number of the multi pattern writing per pattern.

By contrast, according to the present invention, the processes for the frame fields (five fields) may suffice, and the single process may be enough for calculating the pattern writing time per pattern.

Hence, the time for calculating the stage speed increases in proportion to the number of the multi pattern writings according to the prior art method. When the present invention is applied, however, it is feasible to calculate the stage speed irrespective of the number of the multi pattern writings at a higher speed than by the prior art method.

(Method 3)

In the process of "calculating the pattern writing time" in the method 1 and 2, the pattern writing time can be obtained by obtaining a time (Ns×(Tb+Ts)) required for writing the total patterns generally from the number of shots (Ns), a beam irradiating time p(Tb) per shot and a beam settling time (Ts) for each shot, further obtaining a total positioning time (Nf×Tm) for the sub-field from the number of sub-fields (Nf) and a beam deflection time (Tm) to the sub-field, and adding these values. This is formulated such as:

The pattern writing time=$Ns \times (Tb+Ts)+Ns \times Tm$

Hence, the pattern writing time may be calculated per segment from a main-deflection beam settling time and a sub-deflection beam settling time by obtaining the number of shots and the number of the sub-fields.

Further, in the case of using the pattern writing apparatus for writing the pattern while controlling the beam irradiation time per shot, the pattern writing time more approximate to an actual pattern writing time can be calculated when taking into consideration a beam irradiation quantity per shot.

Moreover, there is obtained a total sum of operating periods of a main-deflection beam settling device for deflecting the beam to the sub-field, a sub-deflection beam settling device for deflecting the beam for each shot within the sub-field, a device for partitioning the pattern on a capable-of-writing-pattern shot basis, and a device for calculating the beam irradiation time of each shot, and this total sum may also be set as the pattern writing time.

As discussed above, in the processes according to the prior art, a degree of the pattern density in the frame field is not considered, and, if considered, the standard thereof is limited to what has the maximum number of shots. The stage speed is not necessarily calculated in the field which requires the pattern writing time most. In contrast with this, according to the method 1–3, the degree of the pattern density in the frame field or the stripe field is taken into consideration, and the optimum stage speed inducing no error of the pattern writing can be determined per frame field. Further, it is feasible to calculate at the high speed the stave moving speed in the stripe field in the multi pattern writing, and also enhance a throughput of the charged beam pattern writing apparatus.

The segment width and the block width, though fixed in the methods discussed so far, are not necessarily fixed but may be variable in the methods which follow.

(Method 4)

A method 4 deals with a case where the segment width and the block width are variable in the normal pattern writing.

Figure 9:
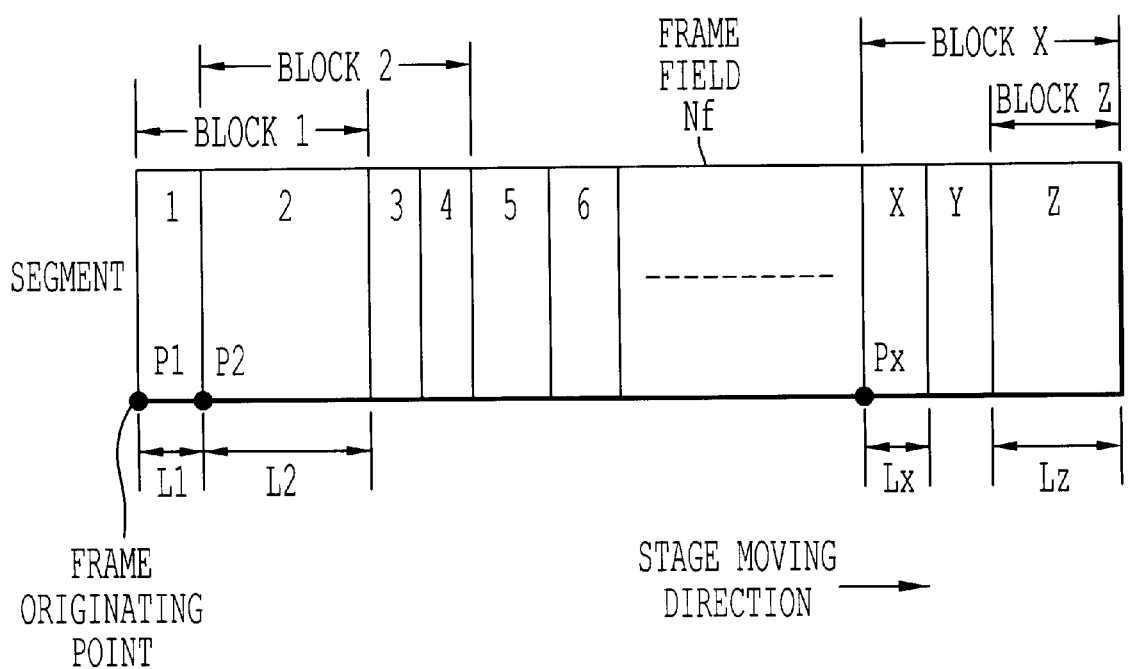
FIG. 9 is a diagram showing a relationship between the segment, the block and the frame which are given arbitrary widths in the normal pattern writing.
Figure 10:
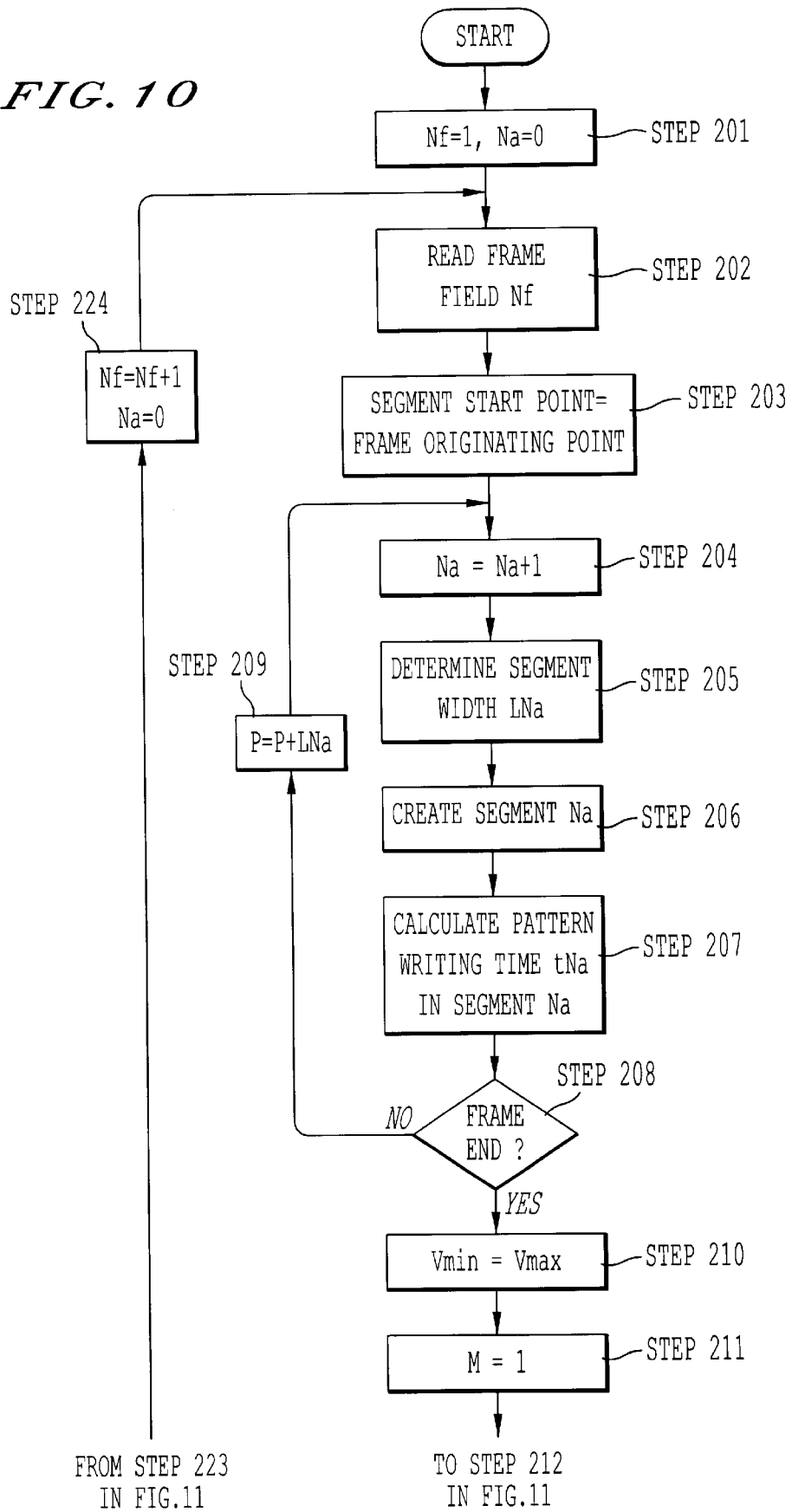
FIG. 10 is a flowchart (1) showing a procedure of determining a stage speed in the normal pattern writing by adopting the segment having an arbitrary width.
Figure 11:
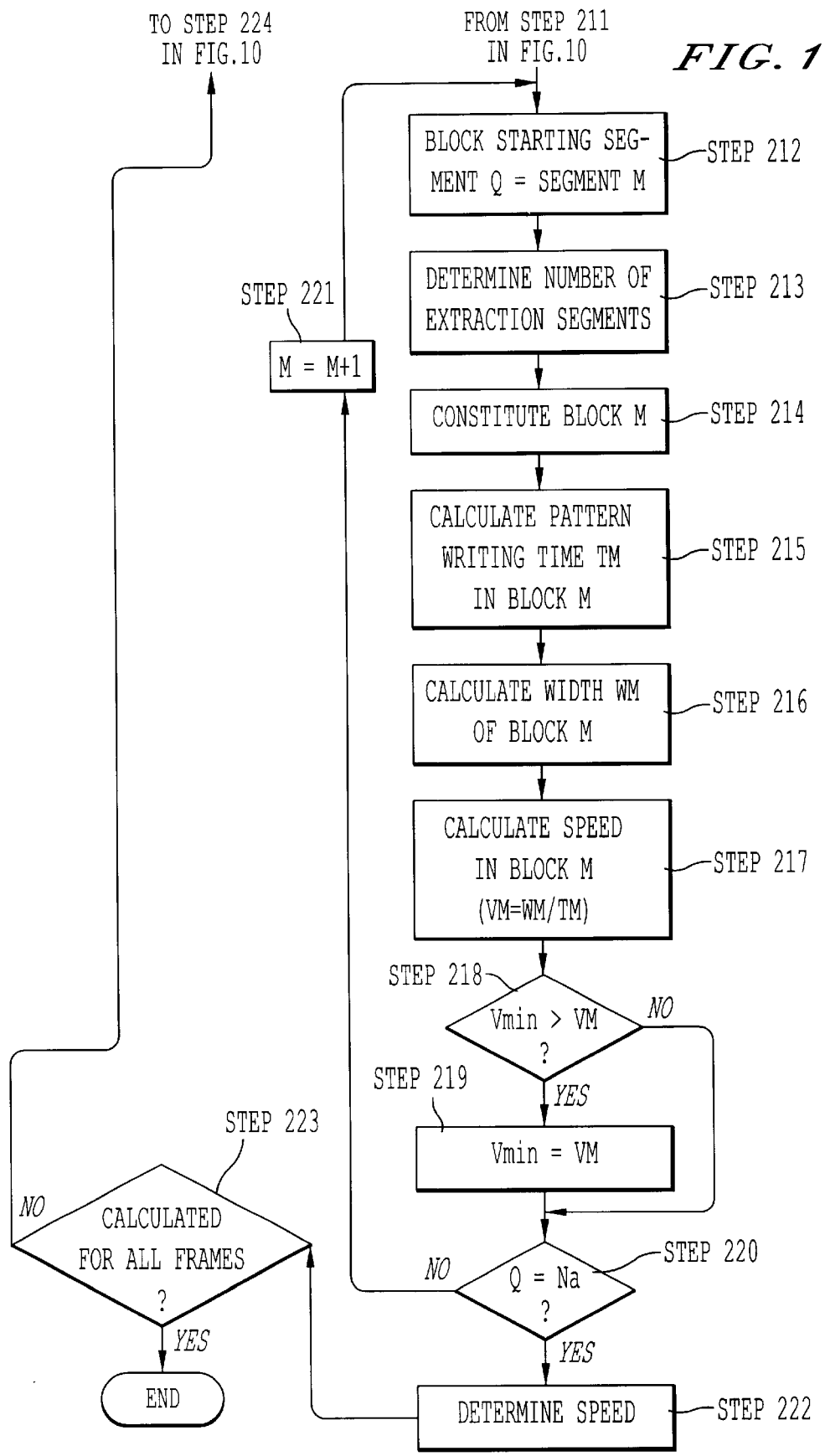
FIG. 11 is a flowchart (2) showing a procedure of determining a stage speed in the normal pattern writing by adopting the segment having the arbitrary width.

FIG. 9 is a schematic diagram showing a relationship between the block and the segment in one frame, which is obtained by the processes that will be hereinafter be described. A frame field is composed of blocks 1, 2, ... X, Z consisting of the segments having segment widths L1, L2, ... Lx, Lz. The method 4 will hereinafter be explained referring to flowcharts in FIGS. 10 and 11.

To begin with, the frame field Nf to be processed is set to an initial value (NF=1), and an index Na of the segment within one frame field is set to an initial value (Na=0) (step 201).

Next, the frame field Nf is read (step 202).

Subsequently, an initial value of a segment starting point P is set as a frame originating point (step 203). In the method 4, a will be obvious from FIG. 9, the frame originating point exists at a leftmost lowermost point in the frame field.

Subsequently, the index Na of the segment within the single frame field is incremented such as Na+1 (step 204).

Next, a segment width LNa is determined (step 205). This segment width LNa may be an arbitrary value (width), and the widths LNa of all the segments may not be necessarily the same.

Next, a segment Na is created based on the starting point P and the width LNa (step 206). For example, in the method illustrated in FIG. 9;

The segment 1 is created based on a segment starting point P1 and a segment width L1; and The segment 2 is created based on a segment starting point P2 and a segment width L2.

Hereinafter, a segment X is likewise created based on a segment starting point Px and a segment width Lx. Note that the segment width Lz of the final segment (the segment Z in FIG. 9) does not necessarily become a set value.

Next, a pattern writing time tNa in the segment Na created in step 6 is calculated (step 207).

Subsequently, it is judged whether or not the segments throughout the frame field are created (step 208). If the segments through the frame field are created, the processing proceeds to next step 210. Whereas if not, however, the processing moves to step 209, wherein the segment starting point P is shifted by the segment width LNa. For example, when the first segment 1 is created, L1 is added to P1, and the starting segment is shifted to P2, thus moving to a process of creating the segment 2.

When judging in step 208 that the segments throughout the frame field are created, an initial value of the minimum stage speed Vmin in one block is set as a maximum stage speed in the pattern writing apparatus (step 210).

Next, an initial value of the block starting segment is set (M=1) (step 211).

Then, a block starting segment Q is set as a segment M (step 212), and the number of extraction segments constituting one block is determined (step 213). The number of segments to be extracted may be arbitrary. Accordingly, the same or a different number of segments may be extracted for each block.

Next, the block starting segment Q and the relevant segments among the number of extraction segments are extracted, and constitute one block M (step 214). For instance, in the example in FIG. 9;

Based the block starting segment 1 and the two extraction segments, the segment 1 and the segment 2 are extracted to constitute the block 1.

Based on the block starting segment 2 and the four extraction segments, the block starting segments 2 through 5 are extracted to constitute the block 2.

A pattern writing time TM of the thus structured block M is calculated (step 215). For example, according to the example shown in FIG. 9;

$T1$ ($T$ of the block 1)$=t1+t2$ $T2$ ($T$ of the block 2)$=t2+t3+t4+t5$ $TX$ ($T$ of the block X)$=tx+ty+tz$ T2 can be obtained also by adding a difference to the pattern writing time of the previous block, e.g., such as:

$T2=T1-t1+t3+t4+t5$

Next, the widths LNa of the extracted segments are summed up, and the block width is calculated (step 216). For instance, in the example shown in FIG. 9, the block width W can be given by:

Block 1 width $W1=L1+L2$

Block 2 width $W2=L2+L3+L4+L5$

Block X width $WX=LX+LY+LZ$

Subsequently, a stage speed VM (VM=WM/TM) of one structured block is calculated from the block width WM calculated in step 216 and the, pattern writing time TM calculated in step 215. For example, in the example shown in FIG. 9;

Block 1 pattern writing time $(V1)=W1/T1=(L1+L2)/(t1+t2)$

Block 2 pattern writing time $(V2)=W2/T2=(L2+L3+L4+L5)/(t2+t3+t4+t5)$

Block X pattern writing time $(VX)=WX/TX=(LX+LY+LZ)/(tx+ty+tz)$

Next, the minimum stage speed Vmin in one block is compared with the stage speed VM obtained in step 216 (step 218).

If a result of this comparison is Vmin>VM, the processing proceeds to step 219, wherein the minimum stage speed Vmin in one block is set as the stage speed VM obtained in step 217.

If Vmin≦VM, the processing advances to step 220 without changing the stage speed.

It is judged in step 220 whether or not the block starts from the segment Na. If Q≠Na, the processing proceeds to step 221, wherein the block starting segment M is incremented by 1 such as M+1. When looped back to step 212, the processes from step 212 to step 220 are repeated.

While on the other hand, if Q=Na, the processing proceeds to next step 222, in which the stage speed in this frame field Nf is determined to be Vmin.

The stage speed is calculated with respect to all the frames, however, it is confirmed in step 223 whether or not the calculation is made with respect to all the frames. If completed, the processing comes to an end. If there are still remaining frame fields, the processing goes to step 224, wherein the frame field Nf to be processed is incremented by 1 such as Nf+1, and the segment Na in one frame field is set to the initial value (Na=0). Then, the processes from step 202 are repeated.

The method 4 also exhibits the effect demonstrated in FIG. 6 in the method 1. Namely, the segment width and the block width are fixed in the method 1, and by contrast it is generalized in the method 4 so that both of the segment width and the block width are freely selectable, and the optimum stage speed is given to the field A in which the high-density pattern exists. To be specific, in accordance with the method 4, the continuous segments are structured as a block while varying the segment starting point, and the pattern writing time in the block corresponding to the field A is calculated base don the pattern writing time in the block 6 composed of the segments 6, 7 with Pb6 being set as its starting point. Hence, it never happens that the pattern writing process can not follow up the stage movement with the result that an error occurs in the pattern writing.

(Method 5)

In a method 5, what is contrived in the method 4 to enable the segment width and the block width to be arbitrarily selected in the normal pattern writing, is applied to the multi pattern writing.

Figure 12:
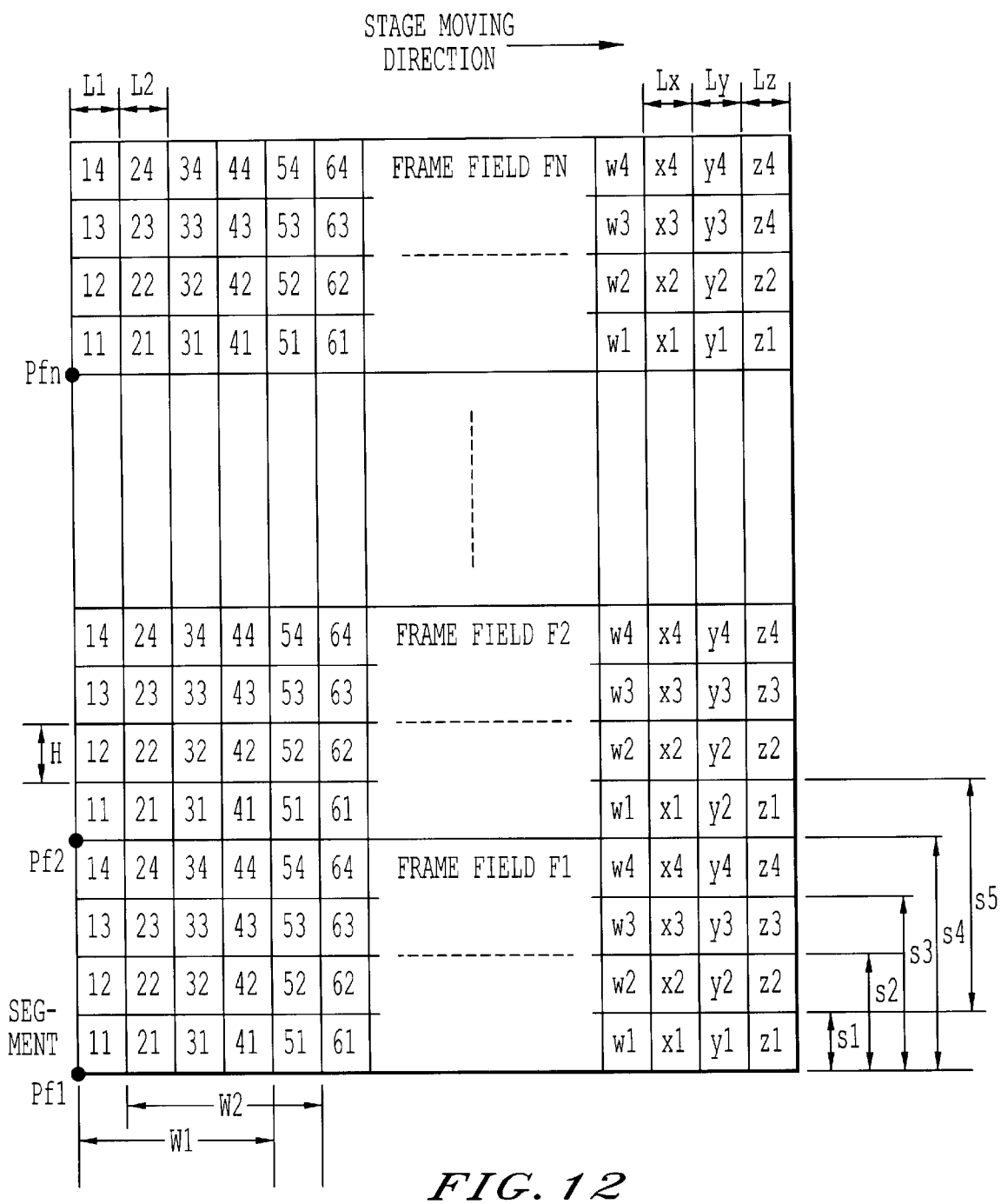
FIG. 12 is a diagram showing a relationship between the segment, the block, the frame and the stripe which are given arbitrary widths in the multi pattern writings.
Figure 13A:
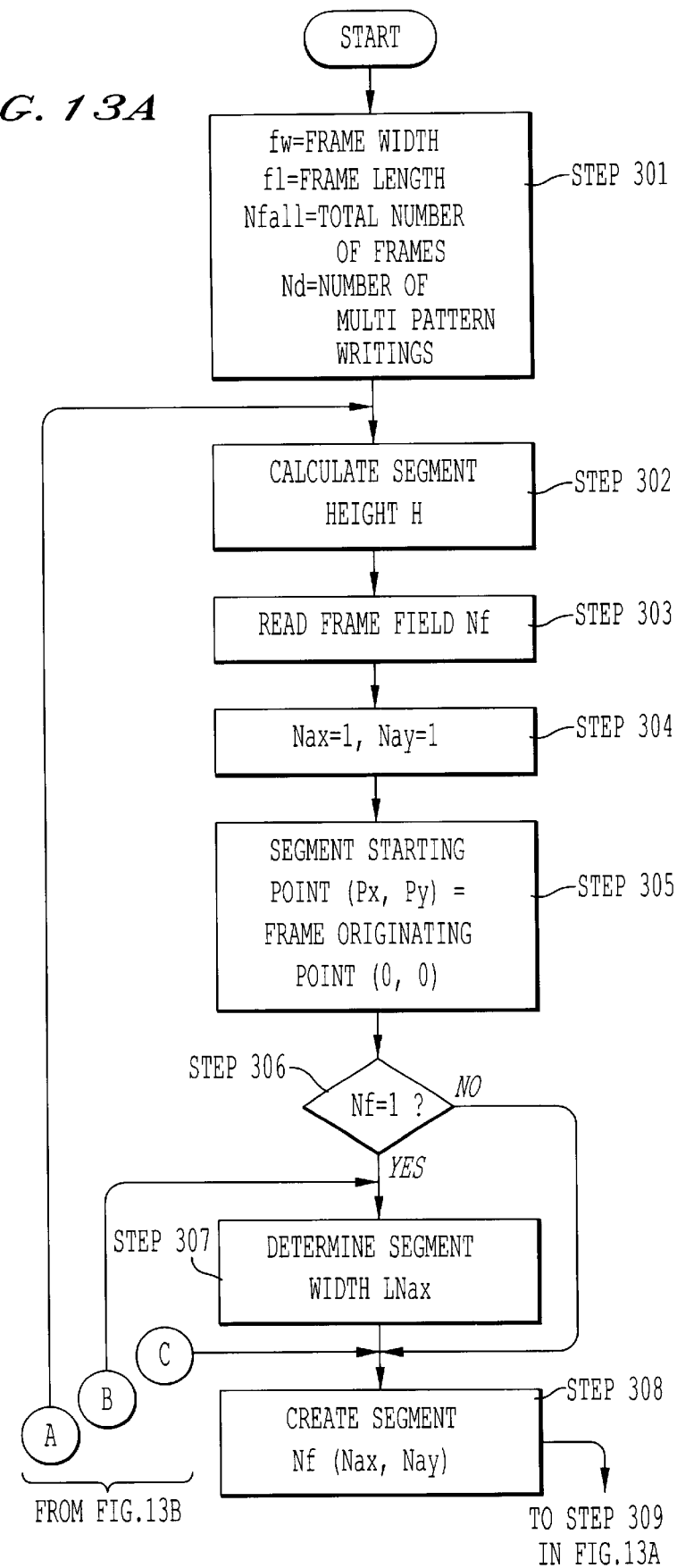
FIG. 13 is a flowchart (1) showing a procedure of determining a stage speed in the multi pattern writings by adopting the segment having an arbitrary width.
Figure 13B:
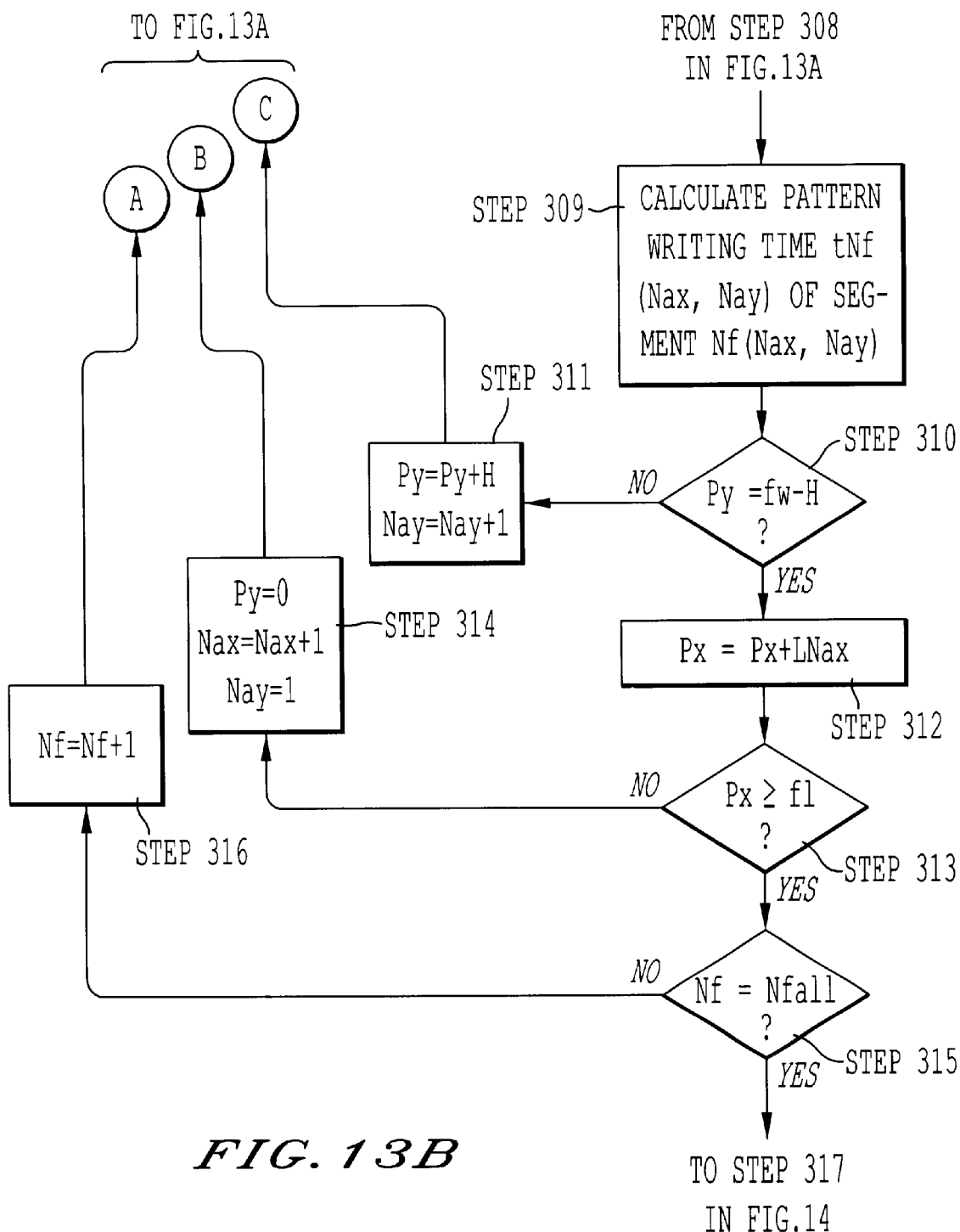
Figure 14:
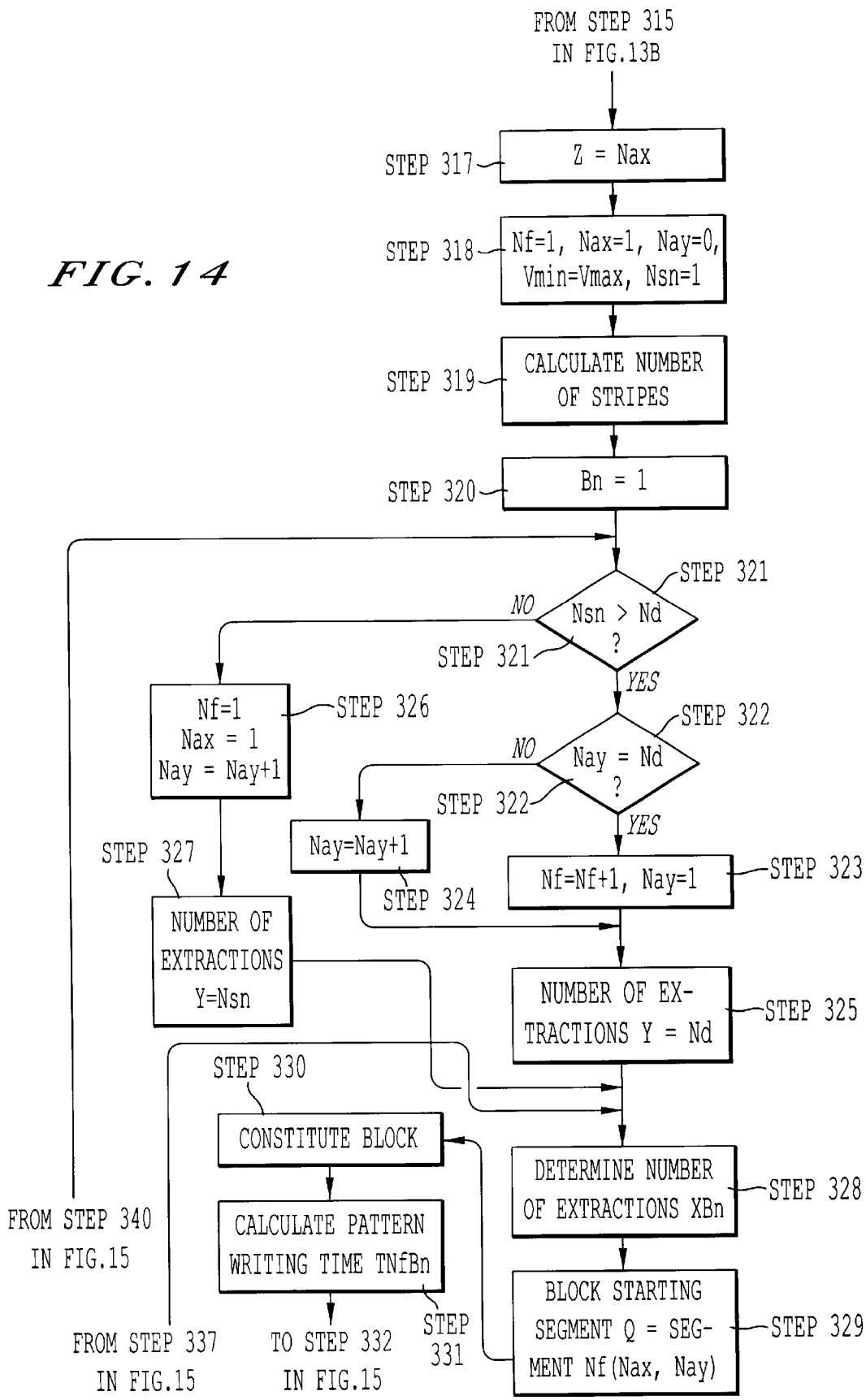
FIG. 14 is a flowchart (2) showing a procedure of determining a stage speed in the multi pattern writings by adopting the segment having the arbitrary width.
Figure 15:
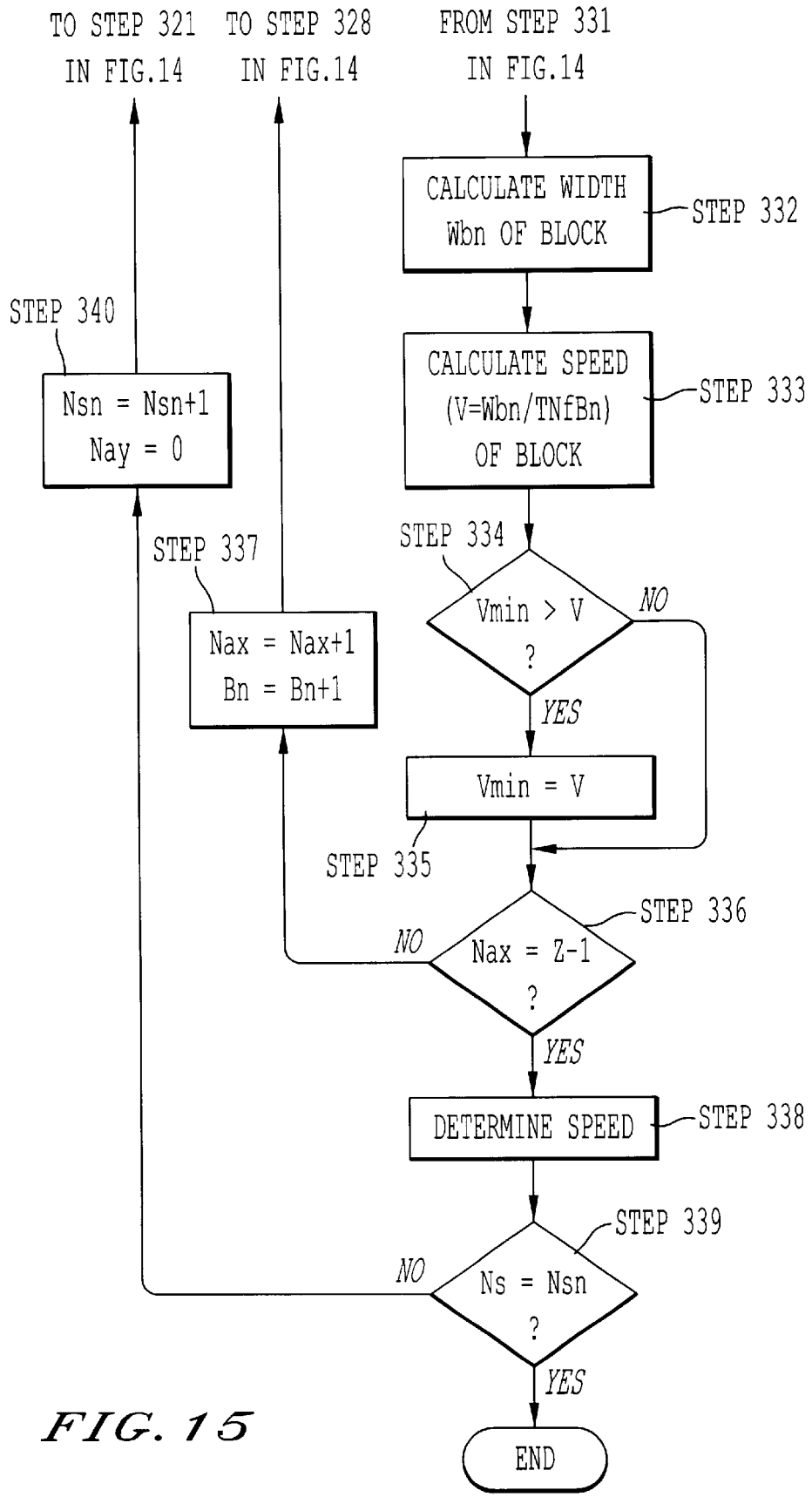
FIG. 15 is a flowchart (3) showing a procedure of determining a stage speed in the multi pattern writings by adopting the segment having the arbitrary width.

FIG. 12 is a schematic diagram showing a relationship between the frame field, the stripe field and the segment in the multi pattern writing in the process of determining the optimum value of the stage speed which is obtained from flowcharts in FIGS. 13 through 15, where the number of the multi pattern writings is set to 4.

To start with, a length (width) of one frame field in the direction orthogonal to the stage moving direction is set in fw, a length of one frame field in the stage moving direction is set in fl, a total number of frames is set in Nfall, the number of multi pattern writings is set in Nd, and a process start frame number 1 is set in Nf, respectively (step 301).

Next, a segment height H is calculated. The segment height H is calculated from the frame width fw and the number-of-multi pattern-writings Nd (H=fw/Nd) (step 302). In the method 5, the number-of-multi pattern-writings Nd=4, and hence H=fw/4.

Subsequently, the frame field Nf is read (step 303).

Next, the initial value is set in the segment index Nf (Nax, Nay) (Nax=1, Nay=1)(step 304): Nax=1, Nay=1.

Next, the frame originating point serving as the segment starting point is set (step 305). In the method 5, the frame originating point is set at the leftmost lowermost point in each frame field, and the frame originating point (0, 0) is set as the segment starting point (Px, Py).

Subsequently, it is checked whether or not the frame field in the middle of being processed is the frame field 1 (step 306). If Nf=1 (the frame field in the middle of being processed is the frame field 1), the processing proceeds to next step 307, wherein the segment width LNax of the segment Nf (Nax,*) is determined. Herein, the symbol * represents an arbitrary value. This determination is, e.g., made such as:

The segment widths of the segment 1 (1, 1), the segment (1, 2) . . . the segment Nf (1,*) . . . the segment N (1, z), are given as L1;

The segment widths of the segment 1 (2, 1), the segment (2, 2) . . . the segment Nf (2,*) . . . the segment N (2, z), are given as L2; and The segment widths of the segment 1 (x, 1), the segment (x, 2) . . . the segment Nf (x,*) . . . the segment N (x, z), are given as Lx.

After finishing step 307, or if Nf≠1 (if the frame field in the middle of being processed is not the frame field 1) in step 306, the processing proceeds to step 308, wherein the segment Nf (Nax, Nay) is created based on the starting point (Px, Py), the segment height H and the segment width LNax. For instance, in the frame field 1;

The segment 1 (1, 1) is created based on the starting point (0, 0), the segment width L1 and the segment height H;

The segment 1 (1, 2) is created based on the starting point (0, H), the segment width L1 and the segment height H; and The segment 1 (2, 3) is created based on the starting point (L1, 2H), the segment width L2 and the segment height H.

Furthermore, a pattern writing time tNf (Nax, Nay) in the segment Nf (Nax, Nay) created in step 308 is calculated (step 309).

Next, it is judged whether or not the starting point Py can be shifted in a y-direction (orthogonal to the stage moving direction) (step 310).

When in a relationship such as Py=fw−H, the starting point can not be shifted, and therefore the processing proceeds to next step 312. When Py≠fw−H, the starting point can be shifted, and hence the processing proceeds to step 311. Herein, for creating a next segment in which the starting point is shifted in the y-direction orthogonal to the stage moving direction, there are made a calculation of Py=Py+H for shifting the starting point Py by the segment height H in the y-direction, and a calculation of Nay=Nay+1 for setting the segment index Nay to Nay+1. Then, the processing returns to step 308. For instance, in the example in FIG. 12, after finishing the process for the segment 1 (1, 1), the following calculations are carried out:

$$Py=0+H=H$$

$$Nay=1+1=2$$

then, the process in step 309 is effected on the segment 1 (1, 2) obtained by the process in step 308.

In step 312, the starting point Px is shifted by the segment width LNax, and it is judged in next step 313 whether or not the segments throughout the frame are created.

When all the segments are already created, the relationship is px≧f1, and the processing proceeds to step 315, in which it is judged whether or not the above processes are executed for all the frame fields.

Whereas if all the segments are not yet created, the processing proceeds to step 314. Herein, for creating the next segment where the starting point is shifted in the stage moving direction (the x-direction), there is executed a process of setting the starting point Py such as Py=0, setting the segment index Nax such as Nax+1, and setting the segment index Nay such as Nay=1. Then, the processing returns to step 307.

If a relationship of Nf=Nfall implying an end of the processes for all the frame fields is recognized in step 315, the processing proceeds to next step 317. Whereas if the processes for all the frames are not yet finished, the frame field Nf is incremented by 1 for shifting it to a next frame process (step 316), and the processing goes back to step 303.

Next, the number of segments (Nax) in one frame field in the x-direction (the stage moving direction) is substituted into Z (step 317). In the method 5, this given such as Z=z.

Next, the processing starting frame number 1 is set in Nf, and the segment index is set such as (Nax, Nay)=(1, 0). Then, the maximum stage speed Vmax of the pattern writing apparatus is set in Vmin, and the process starting stripe number 1 is set in Nsn (step 318).

Subsequently, the number-of-stripes Ns is calculated by the following formula (step 319).

Number-of-stripes=number-of-frame-fields+(number-of multi pattern-writings−1)×(frame field+1)

In the case of the method 5,

Number-of-stripes $Ns=N+(4-1)\times(4+1)=N+15$ subsequently, a block index Bn is set to 1 (step 320).

Next, the processed stripe field Nsn is compared with the number-of-multi pattern-writings Nd (step 321), and, if Nsn>Nd, the processing proceeds to step 322. If Nsn≦Nd, the processing diverts to step 326.

In step 322, the segment index Nay is compared with the number-of-multi pattern-writings Nd to judge whether both of these values are the same or not. Then, if Nay=Nd, the processing proceeds to step 323. If Nay≠Nd, the processing advances to step 324.

The segment index Nay is incremented by 1 in step 324. Namely, Nay=Nay+1.

In step 323, the frame field Nf is incremented by 1 such as Nf+1, and the segment index Nay is set to 1 (Nay=1).

While on the other hand, Nsn≦Nd, the segment index Nay is incremented such as Nay+1 without advancing the frame, and the processing proceeds to step 325.

In step 325, the number of extraction segments in the y-direction is set to the number-of-multi pattern-writings Nd.

Further, when judging in step 321 that Nsn≦Nd, the frame field Nf is shifted to the frame field 1, and the segment index Nax is set to 1 (Nax=1), while the segment index Nay is incremented by 1 such as Nay+1 (step 326).

Then, the number of extraction segment in the Y-direction is set to the stripe field Nsn which is being processed at present.

Next, the number of extraction segments in the X-direction in a block Bn is determined (step 328). Note that the number of extraction segments on this occasion may be arbitrary. Accordingly, the number of extraction segments in all the blocks may be the same or different.

Next, the starting segment constituting the block Bn is set to the segment Nf (Nax, Nay) (step 329).

Next, a block NfBn from a starting segment q is structured based on an extraction number Xbn, and an extraction number Y (step 330).

When applied to the case shown in FIG. 12, the block structure is given by way one example which follows:

the starting segment Q=1 (1, 1), the extraction number X1=4, the extraction number Y=1, the following segments are extracted therefrom, segment 1 (1, 1), segment 1 (2, 1), segment 1 (3, 1), segment 1 (4, 1), and the block 1 in the stripe field 1 is thus structured.

The starting segment Q=1 (3, 1), the extraction number X1=4, the extraction number Y=2, the following segments are extracted therefrom, segment 1 (2, 1), segment 1 (2, 2), segment 1 (3, 1), segment 1 (3, 2), segment 1 (4, 1), segment 1 (4, 2), segment 1 (5, 1), segment 1 (5, 2), and the block 2 in the stripe field 2 is thus structured.

The starting segment Q=1 (3, 2), the extraction number X1=4, the extraction number Y=4, the following segments are extracted therefrom, segment 1 (3, 2), segment 1 (3, 3), segment 1 (3, 4), segment 2 (3, 1), segment 1 (4, 2), segment 1 (4, 3), segment 1 (4, 4), segment 2 (4, 1), segment 1 (5, 2), segment 1 (5, 3), segment 1 (5, 4), segment 2 (5, 1), segment 1 (6, 2), segment 1 (6, 3), segment 1 (6, 4), segment 2 (6, 1), and the block 3 in the stripe field 5 is thus structured.

Subsequently, a pattern writing time TnfBn in the block structured in step 330 is calculated (step 331). On this occasion, this might involve the use of the pattern writing time in each segment which has been obtained in step 309. In the case of FIG. 12;

A stripe-field-1 block-1 pattern writing time $T11=t1\,(1,1)+t1\,(2,1)+t1\,(3,1)+t1\,(4,1)$;

A stripe-field-2 block-2 pattern writing time $T22=t1\,(2,1)+t1\,(2,2)+t1\,(3,1)+t1\,(3,2)+t1\,(4,1)+t1\,(4,2)+t1\,(5,1)+t1\,(5,2)$;

and

A stripe-field-5 block-3 pattern writing time $T53=t1\,(3,2)+t1\,(3,3)+t1\,(3,4)+t2\,(3,1)+t1\,(4,2)+t1\,(4,3)+t1\,(4,4)+t2\,(4,1)+t1\,(5,2)+t1\,(5,3)+t1\,(5,4)+t2\,(5,1)+t1\,(6,2)+t1\,(6,3)+t1\,(6,4)+t2\,(6,1)$ Next, the widths LNax of the extracted segments are summed up, and a block width WBn is calculated (step 332). On this occasion, the segment width obtained in step 307 is used. For instance, in the example shown in FIG. 12;

Stripe-1 block-1 width $W1=L1+L2+L3+L4$

Stripe-2 block-2 width $W2=L2+L3+L4+L5$

Stripe-5 block-3 width $W3=L3+L4+L5+L6$

Next, the stage speed V (V=WBn/TnfBn) in one structured block is calculated from the block width WBn determined in step 32 and the pattern writing time TNfBn calculated in step 331 (step 333).

Then, this stage speed V is compared with the minimum stage speed Vmin in one block (step 34), and, if Vmin>V, the processing proceeds to step 335. Herein, the minimum stage speed Vmin in one block is set as the stage speed V obtained in step 333, and processing goes to step 336. While on the other hand, if Vmin≦V, the processing proceeds directly to step 336.

It is checked in step 336 whether or not the segment index Nax reaches a segment disposed one before the last segment in the stripe field. If reached, the processing proceeds to step 338, wherein the stage speed in the stripe field Nsn is set as Vmin. Whereas if not reached, the processing proceeds to step 337, in which the segment index Nax is incremented by 1 (Nax+1). At the same time, the block index is incremented by 1 (Bn+1). Then, the processes from step 328 to step 335 are repeated.

Next, it is judged whether or not the stage speed is calculated for all the stripe fields (step 339).

With a completion of the calculation for all the stripe fields, if NS=Nsn, this process comes to an end. When other than this case, the processing proceeds to step 340. Herein, the stripe field index Nsn is incremented by 1 (Nsn+1) in order to shift the calculation target to the next stripe field, and the segment index Nay is set to 0. Then, the processing returns to step 321, and the processes up to step 338 are repeated.

Note that in the "pattern writing time calculation" process in the methods 4 and 5 with the segment width and the block width being set variable, the pattern writing time may also be obtained by obtaining a time (Nsx (Tb+Ts)) required for a total pattern writings generally from the number of shots (Ns), a beam irradiation time (Tb) per shot and a beam settling time (Ts) to each shot, and also a total positioning time (NfxTm) to the sub-field from the number of sub-fields (Nf) and a beam deflection time (Tm) to the sub-field, and adding these values. Namely, the pattern writing time is given such as Nsx (Tb+Ts)+BsxTm. Hence, the number of shots and the number of sub-fields are obtained, and the pattern writing time may also be calculated from the main-deflection beam settling time and a sub-deflection beam setting time. Further, if classified as a pattern writing apparatus for writing the pattern while controlling the beam irradiation time per shot, it is feasible to calculate a pattern writing time more approximate to an actual pattern writing time when taking a beam irradiation quantity per shot into consideration. Moreover, there is obtained a total sum of operating periods of a main-deflection beam settling device for deflecting the beam to the sub-field, a sub-deflection beam settling device for deflecting the beam for each shot within the sub-field, a device for partitioning the pattern on a capable-of-writing-pattern shot basis, and a device for calculating the beam irradiation time of each shot, and this total sum may also be set as the pattern writing time.

Figure 37:
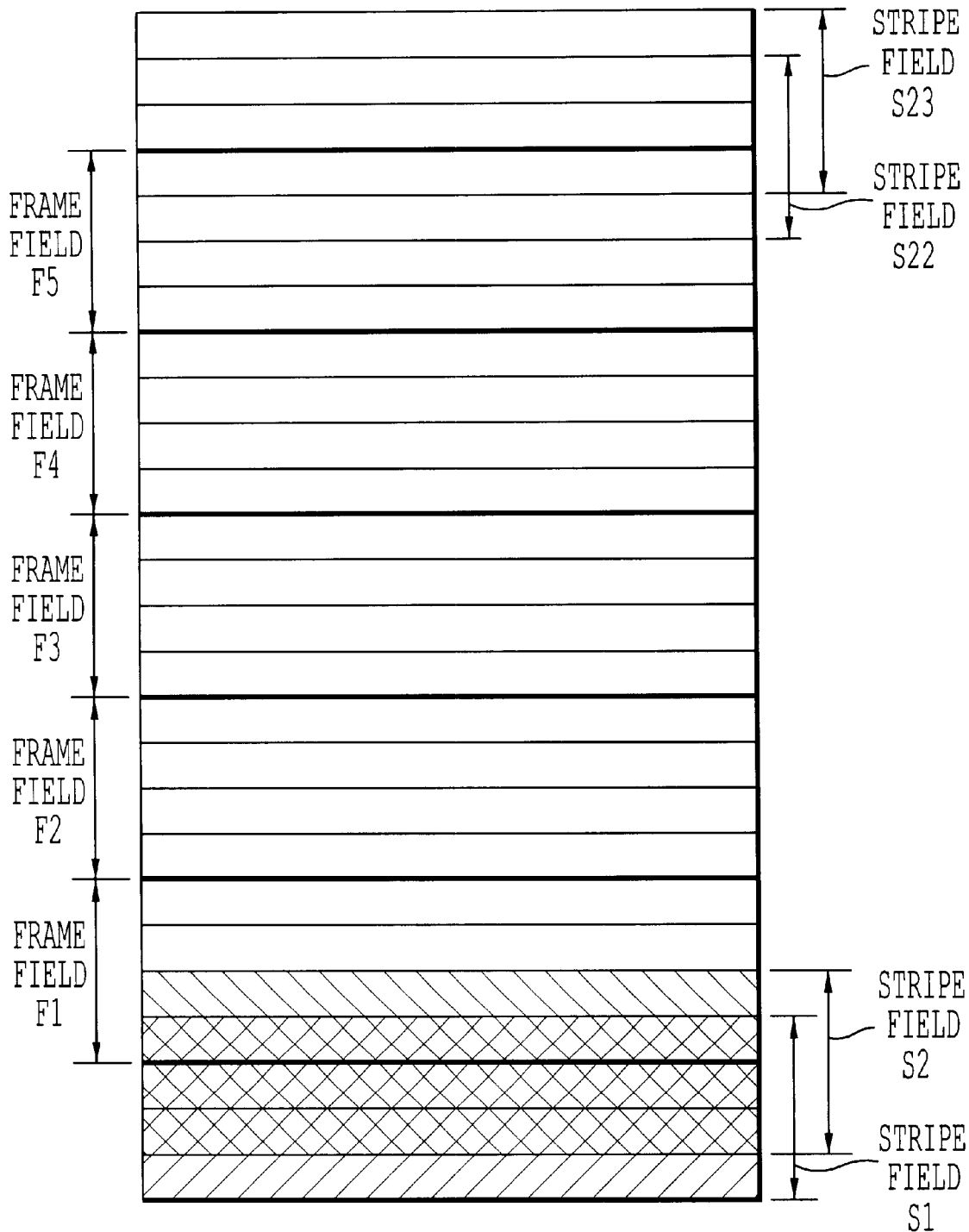
FIG. 37 is a diagram showing how large a calculation quantity is in the prior art multi pattern writings.

An effect of the method 5 in which the multi pattern writings are conducted with the above-described segment width and block width being set variable, will be explained referring to FIG. 37.

As discussed above, according to the prior art, With the number of the stripe fields being 23, the processing is executed for all the (23) stripe fields, and there is the necessity for executing the process of calculating the pattern writing times corresponding to the number of the multi pattern writings (four times) per pattern.

By contrast, according to the present invention, the processes for the frame fields (five fields) may suffice, and the single process may be enough for calculating the pattern writing time per pattern.

Hence, the time for calculating the stage speed increases in proportion to the number of the multi pattern writings according to the prior art method. When the present invention is applied, however, it is feasible to calculate the stage speed irrespective of the number of the multi pattern writings at a higher speed than by the prior art method.

(Method 6)

As discussed above, the pattern writing data created through the data creating process are read per frame (stripe) from the magnetic disk 41, and the pattern is written, wherein the LSI chip has high- and low-pattern-density areas mixed with consecutive variations. Accordingly, there might differ the time required for the process of writing the pattern per frame (stripe) constituting the chip, and, with this aspect, it is desired that the stage speed set per frame (stripe) when executing the pattern writing process be optimized in terms of enhancing the throughput.

A specific method of calculating an optimum value of the stage speed with respect to the stripe in the multi pattern writing, will be explained with reference to FIGS. 16, 17 and 18.

Figure 16:
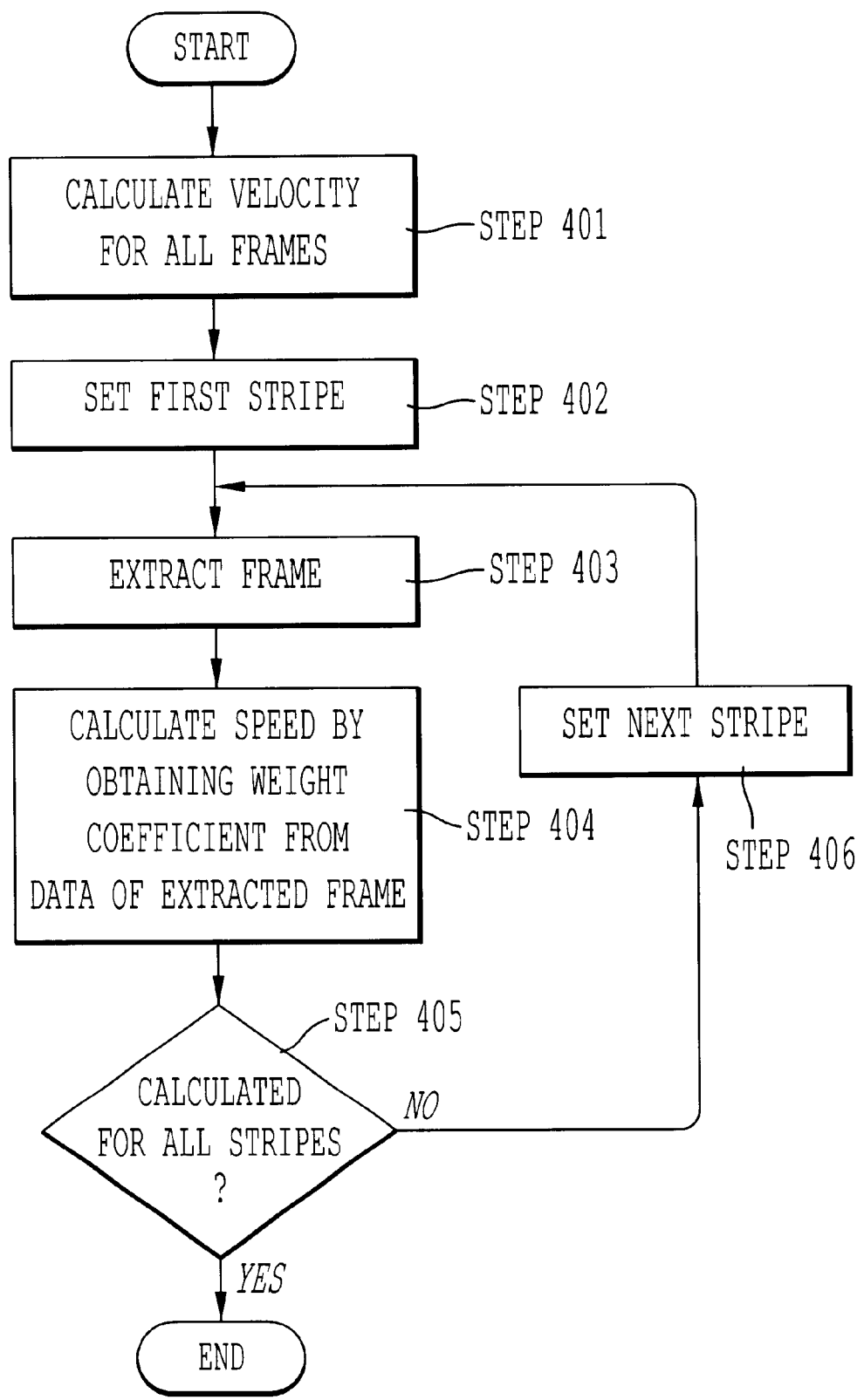
FIG. 16 is a flowchart showing a process of determining the speed.

FIG. 16 shows a processing flow of this calculating method. To begin with, the stage speed is calculated for all the frames (step 401). Next, a frame relative to a speed calculation target stripe is extracted (step 402, 403).

Let Ti be a time necessary for writing the pattern of each frame i relative to the stripe, and a time required for writing the pattern of only an area relative to the stripe of the frame i, can be approximated by iTi. Herein, i is a coefficient determined from the frame data. Accordingly, the pattern writing time of the stripe can be expressed as below by use of the pattern writing time Ti and a weight coefficient i of the frame i:

$$T=iTi$$

i={stripe-related frame Ni}

Hereinafter, there will be explained a case where there are two frames relative to the stripe for simplifying the explanation. Note that it is also easy to extend to such a case that the number of such frames is 3 or more.

Figure 17:
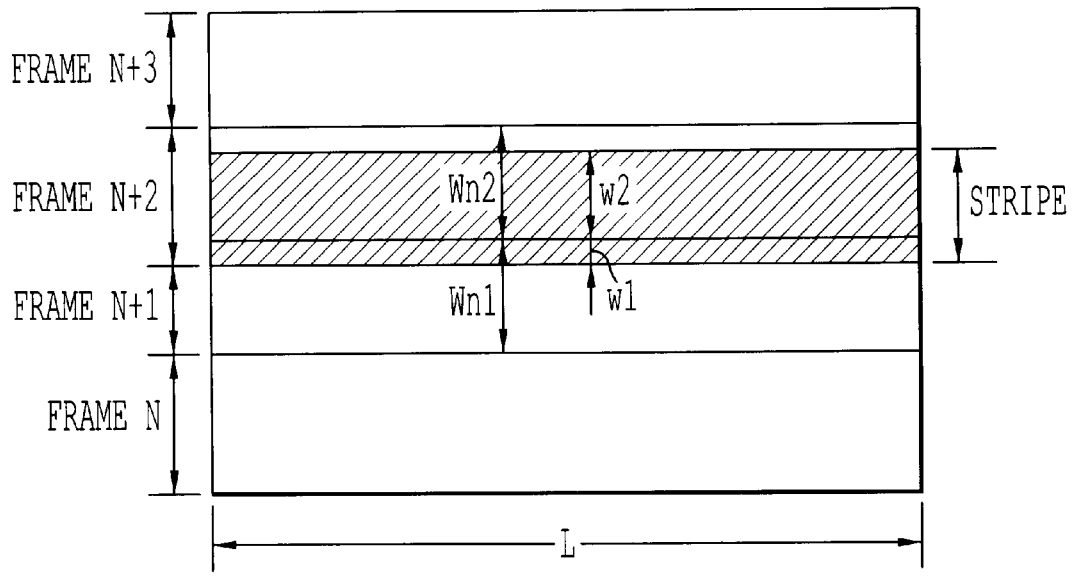
FIG. 17 is an explanatory diagram showing why the width is used for determining the speed.

In the case of FIG. 17, the frames relative to a target stripe S are a frame N+1 and a frame N+2. A coefficient (weight) is obtained from the extracted frame data, and a speed in the stripe is calculated (step 404).

Referring to FIG. 17, coefficients (Z1, Z2) are determined based on a field (areal size) of each frame relative to the stripe. Note that the method 6 deals with an example where the number of the frames relative to the stripe is 2.

Frame $N+1$ width=$Wn1$,

Frame $N+2$ width=$Wn2$,

Relative-to-stripe-$S$ frame $N+1$ width=$w1$,

Relative-to-stripe-$S$ frame $N+2$ width=$w2$.

Calculation of coefficient (weight)

Coefficient for the frame $N+1$ is: $Z1=w1/wn1$,

Coefficient for the frame $N+2$ is: $Z2=w2/wn2$.

Calculation of speed
Assuming that:

Required-for-writing-pattern-in-frame $N+1$ time=$T1$,

Required-for-writing-pattern-in-frame $N+2$ time=$T2$,

The speed $Vs$ in the stripe $S$ can be given by $Vs=L/(T1 \times Z1 + T2 \times Z2)$.

Figure 18:
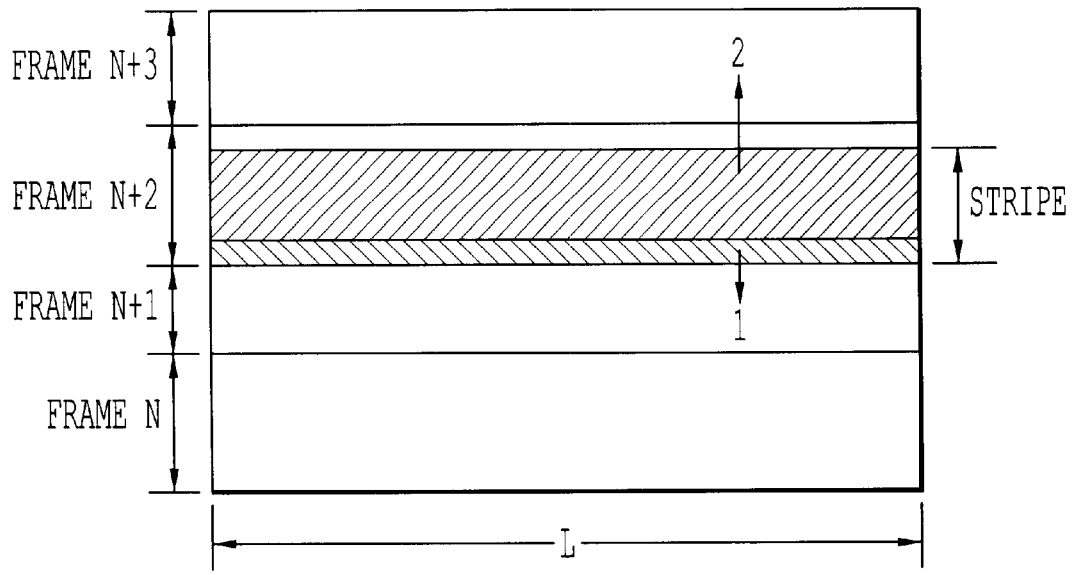
FIG. 18 is an explanatory diagram showing why the number of shots is used for determining the speed.

Referring to FIG. 18, coefficients (U1, U2) are determined based on the number of shots of each frame relative to the stripe. Note that the method 6 deals with an example where the number of the frames relative to the stripe is 2.

Frame $N+1$ total number-of-shots=$Shn1all$,

Frame $N+2$ total number-of-shots=$Shn2all$,

Relative-to-stripe-$S$ frame $N+1$ number-of-shots=$Shn1$ (Lower part of the stripe), Relative-to-stripe-$S$ frame $N+2$ number-of-shots=$Shn2$ (Upper part of the stripe).

Calculation of coefficient (weight)

Coefficient for the frame $N+1$ is: $U1=Shn1/Shn1all$,

Coefficient for the frame $N+2$ is: $U2=Shn2/Shn2all$.

Calculation of speed
Assuming that:

Required-for-writing-pattern-in-frame $N+1$ time=$T1$,

Required-for-writing-pattern-in-frame $N+2$ time=$T2$,

The speed $Vs$ in the stripe $S$ can be given by $Vs=L/(T1 \times U1 + T2 \times U2)$.

In the method illustrated in FIGS. 17 and 18, the speed Vs in the strip S is calculated based on the coefficients (Z1, Z2, U1, U2) obtained from the areal size and the number of shots, and on the pattern writing times T1, T2 in the frame. Further, the coefficient (weight) may be determined by use of the pattern data such as a pattern areal size (covering rate), the number of patterns and the sub-field data.

The processes described above are executed for all the stripes, and the stage speed in each stripe is obtained (step 405, 406). The stage speed is obtained from the values (the speed, the pattern writing time and the number of shots) obtained for the frame, and can be therefore calculated at the high speed.

(Method 7)

Still another pattern writing method will be described referring to FIGS. 19 and 20. Note that the method 7 deals with the case where the number of frames relative to the stripe is 2.

Figure 19:
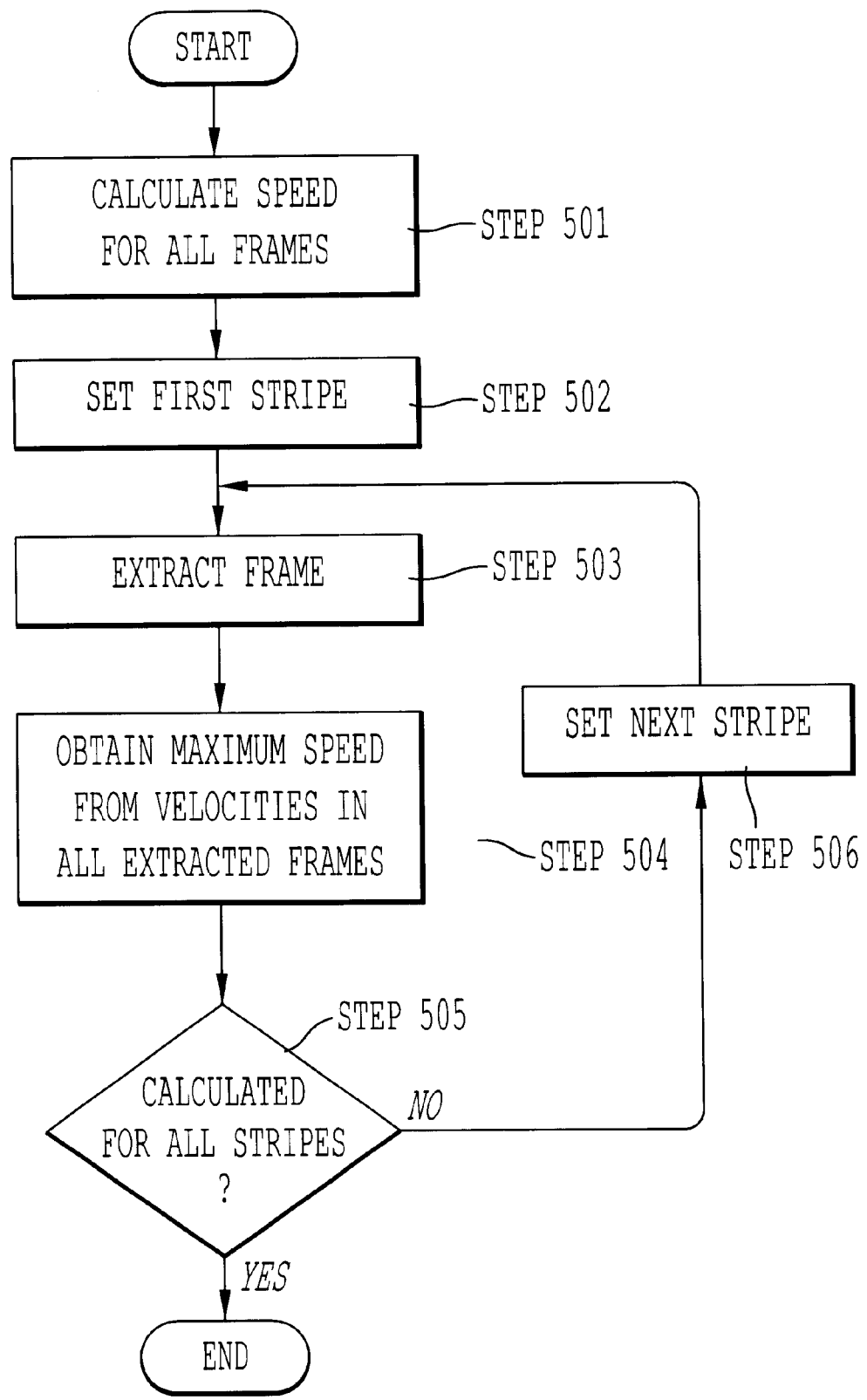
FIG. 19 is a flowchart showing another method relative to the speed determining process.
Figure 20:
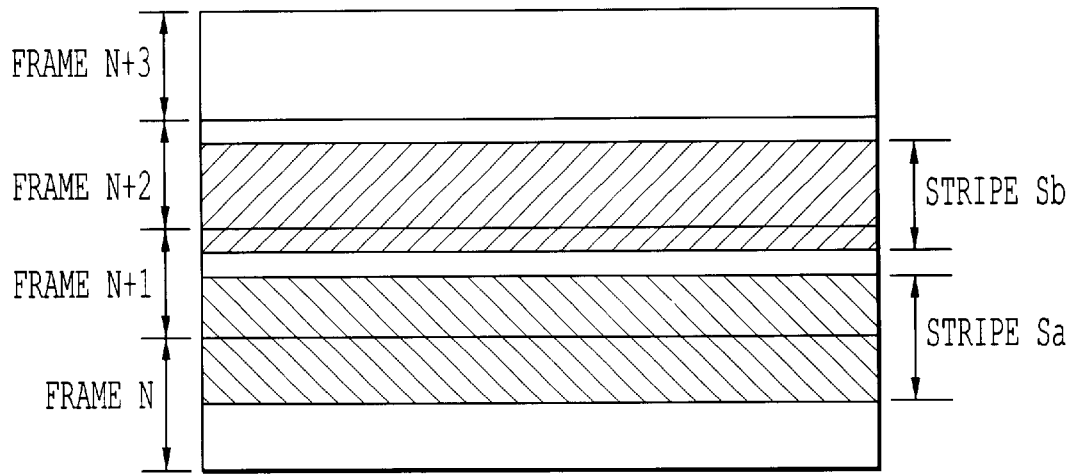
FIG. 20 is an explanatory diagram showing why the stage speed is used for determining the speed.

FIG. 19 shows a processing flow of this calculation method. To start with, the stage speed is calculated for all the frames (step 501). Next, the frames relative to the speed calculation target stripe are extracted (step 502,503). In the case of FIG. 20, the frames relative to a target stripe Sa are a frame N and a frame N+1. The frames relative to a target stripe Sb are the frame N+1 and a frame N+2. Then, the minimum speed among the speeds of the extracted frames is obtained (step 504), and this value is set as the stage speed in the target stripe. Referring to FIG. 20, the stage speed in the stripe Sa is, when Va<Vb, therefore Va. Similarly, the stage speed in the stripe Sb is, when Vb<Vc, therefore Vb.

The process explained above is effected for all the stripes (step 505, 506), and the stage speed in each stripe is obtained. The stage speed is obtained from the values obtained for the frame, and can be therefore calculated at the high speed.

Further, the stripe speed obtained in the method 1 is set as Vmax, the stripe speed Vmin obtained in the method 7 is set as Vmin, and the stripe speed Vs may be determined so as to establish a relationship of Vmin≦Vs≦Vmax.

(Method 8)

Figure 22:
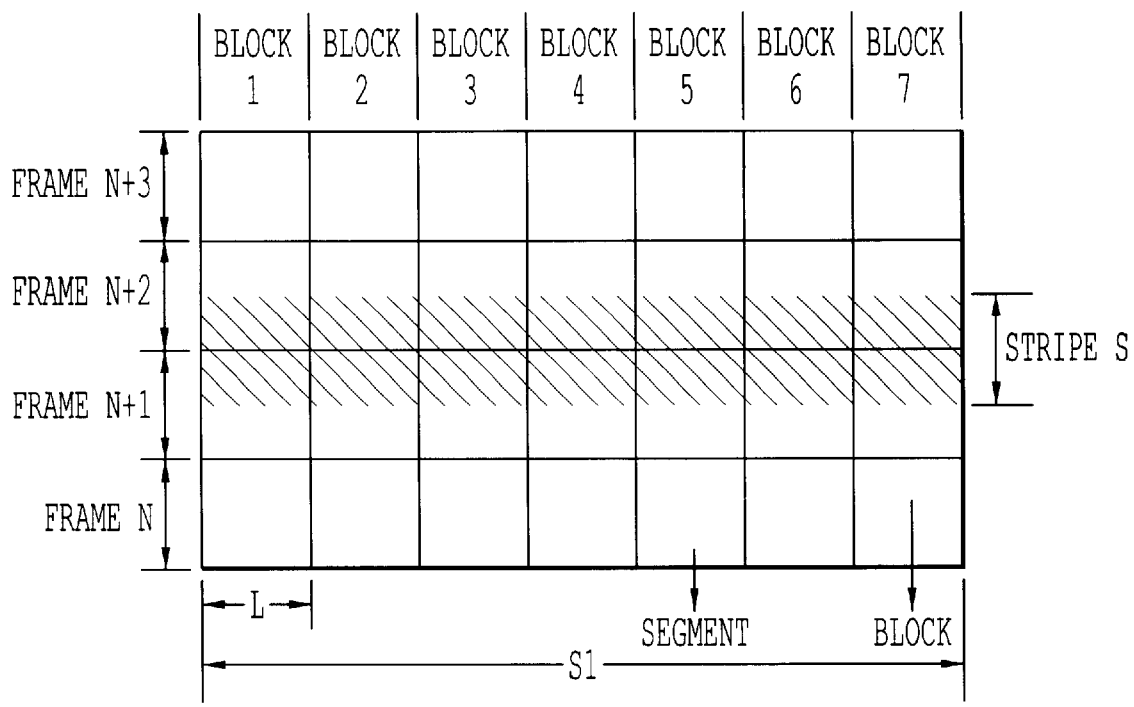
FIG. 22 is an explanatory diagram showing a relationship between the block, the segment and the stripe.

A method 8 will be explained referring to FIGS. 21 and 22.

Figure 21:
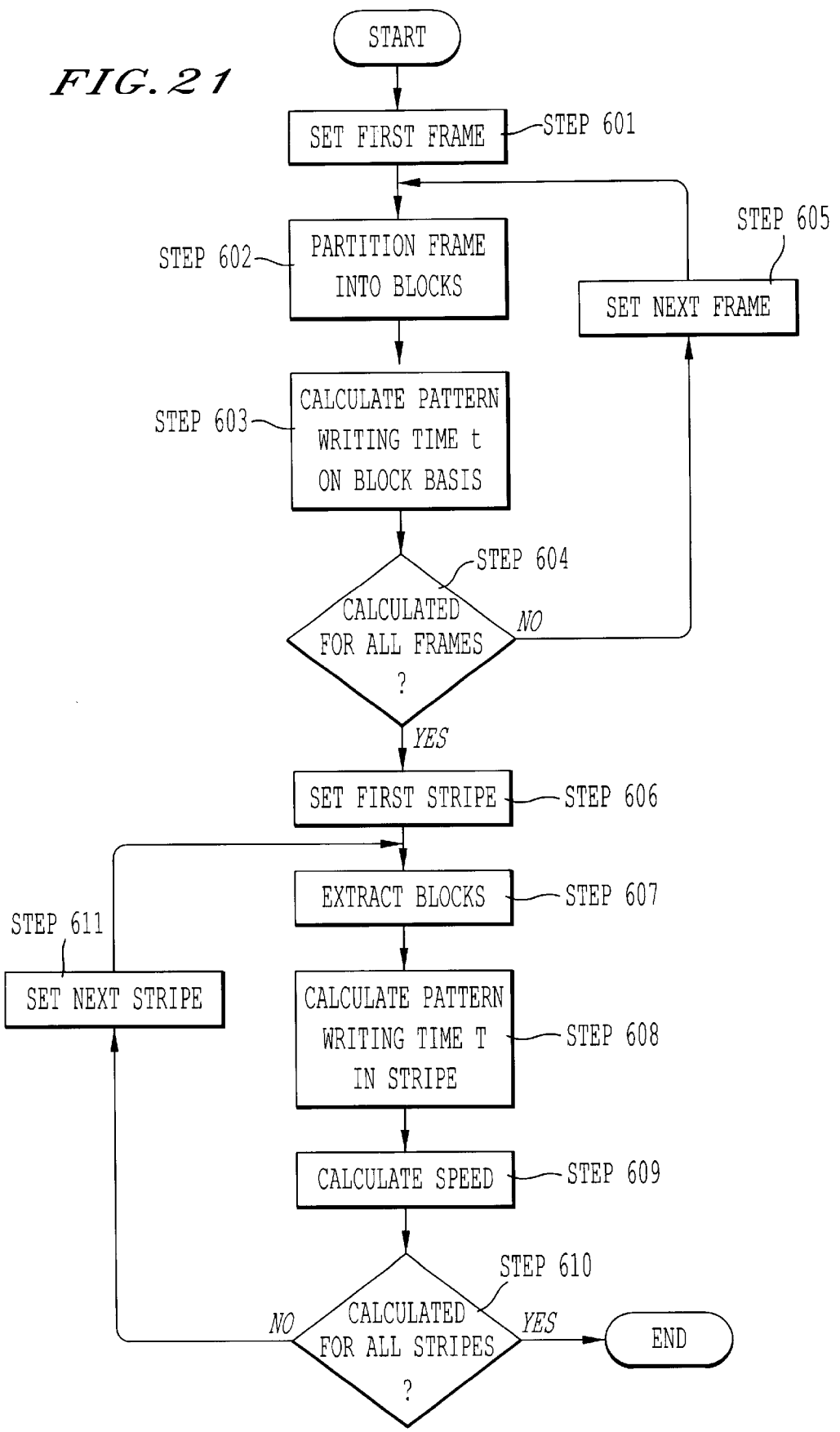
FIG. 21 is a flowchart showing still another method relative to the speed determining process.

FIG. 21 shows a processing flow of this calculation method. At the first onset, as shown in FIG. 22, the frame is partitioned by the width L in the stage moving direction (a partitioned segment is referred to as a block) (step 601, 602). A pattern writing time t is obtained on this block basis (step 603). This process is performed for all the frames (step 604, 605), and as a result a pattern writing time map is created on the block basis.

Next, the blocks in a region corresponding to a speed calculation target stripe are extracted (step 606,607). There is obtained a total sum T of pattern writing times ts of the region (hatched in FIG. 22) relative to the stripe defined by the extracted blocks (step 608). The target stripe speed Vs is given from the stripe length S1 and the pattern writing time T, such as Vs=S1/T (step 609, 610, 611).

Further, the calculation of the pattern writing time t on the block basis may also involve the use of a method disclosed in Japanese Patent Application Laid-Open No.4-61221.

According to the method described above, the single+ process of calculating the pattern writing time may suffice regardless of the number of the multi pattern writings, and the pattern writing time per stripe can be calculated at the high speed.

(Method 9)

Figure 24:
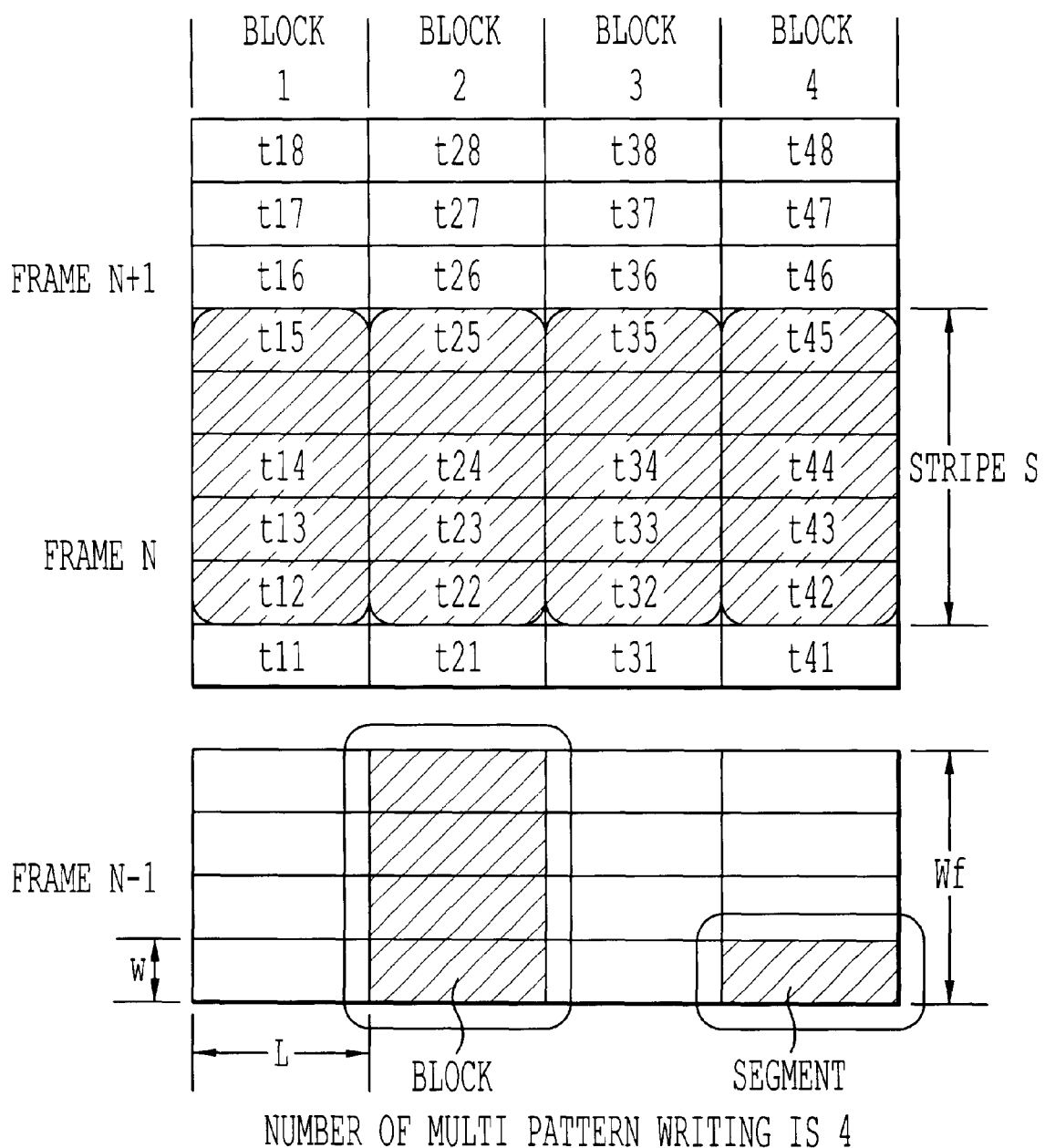
FIG. 24 is a flowchart showing how a maximum pattern writing time is obtained from pattern writing times on a block basis of the stripe.
Figure 25:
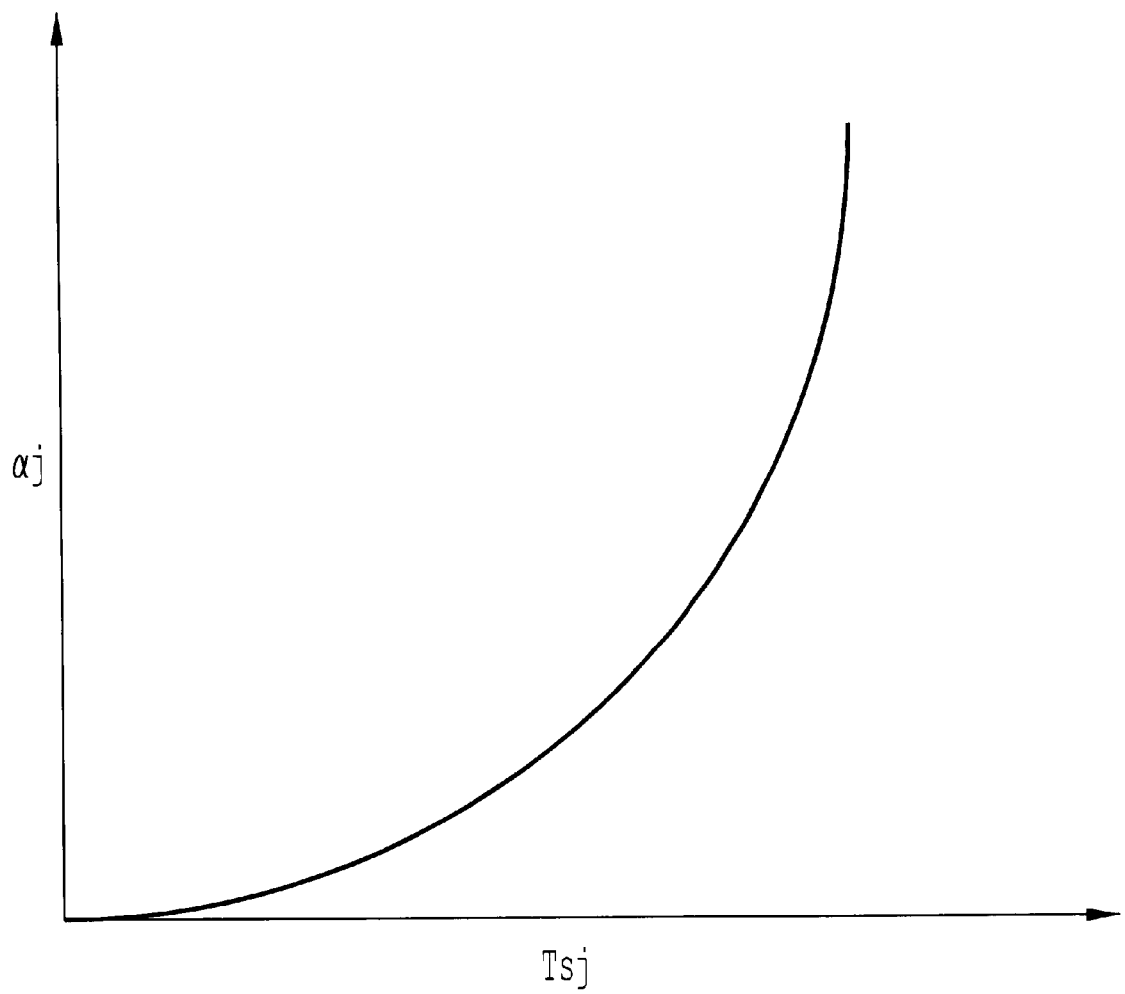
FIG. 25 is a graph showing a relationship between j and Tsj.
Figure 26:
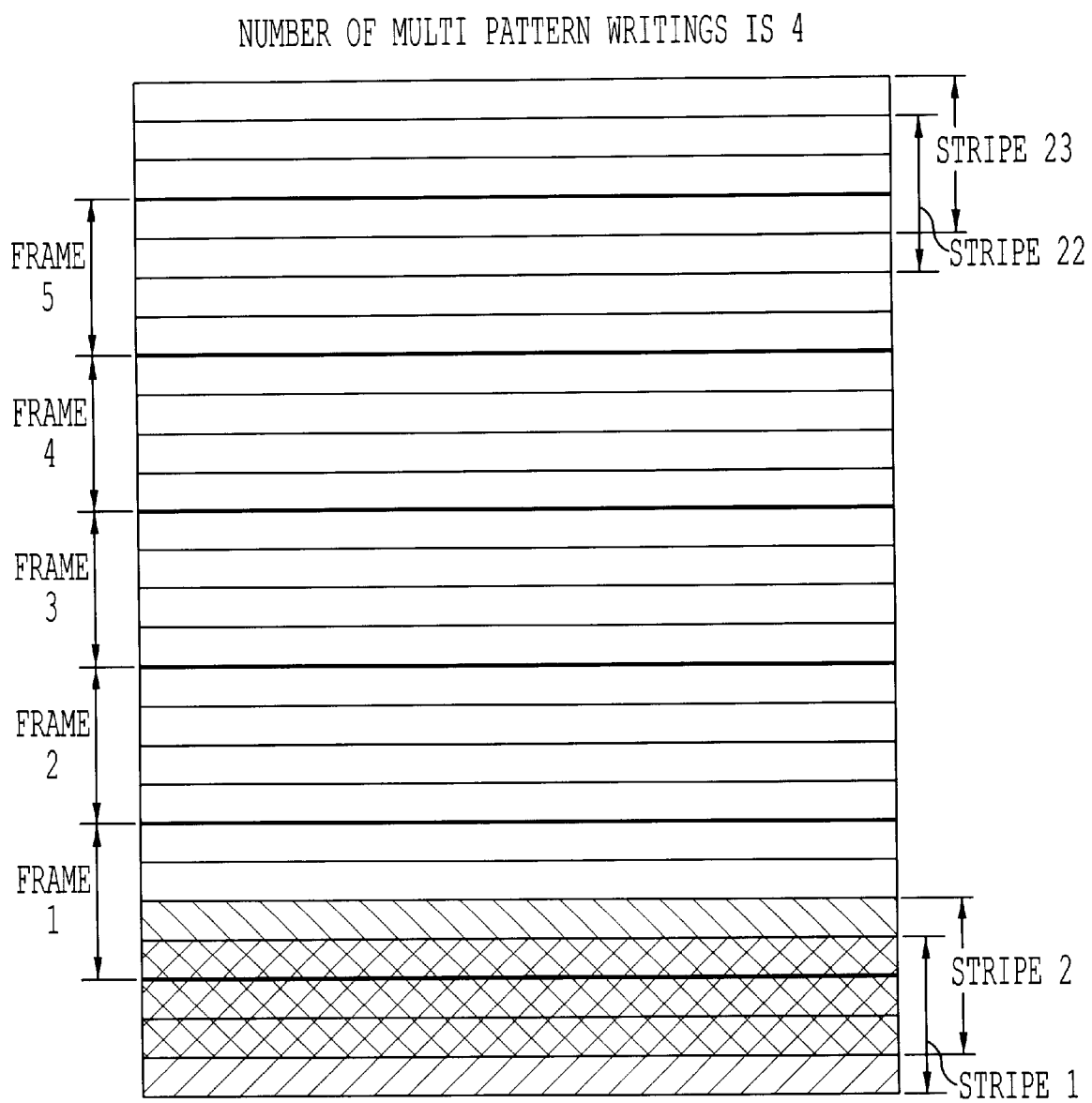
FIG. 26 is an explanatory diagram showing a relationship between the stripe and the frame.

A method 9 will be discussed referring to FIGS. 23, 24 and 25.

Figure 23:
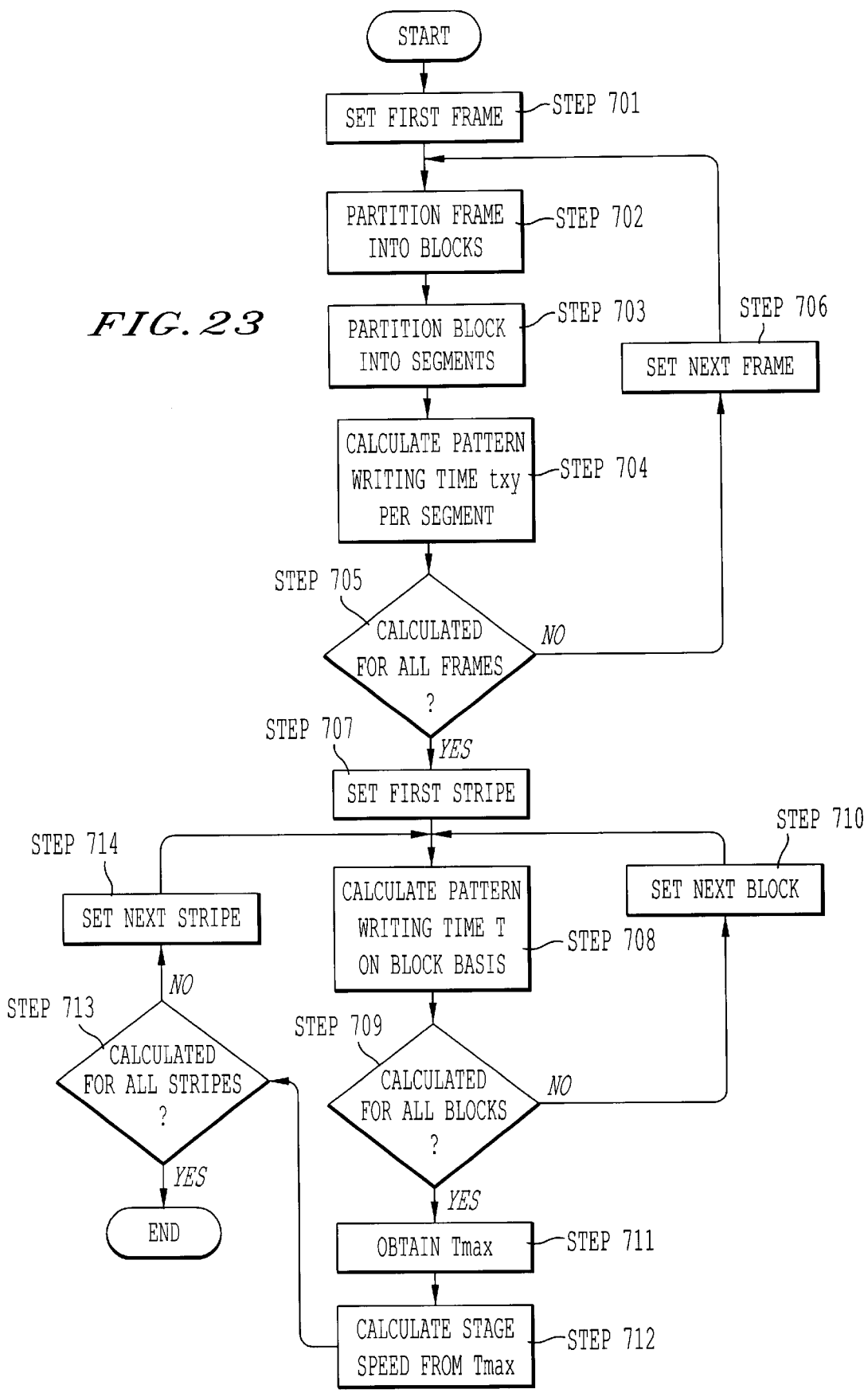
FIG. 23 is a flowchart showing a further method relative to the speed determining process.

FIG. 23 shows a processing flow of this calculation method. To begin with, as shown in FIG. 24, the frame is partitioned by the width L in the stage moving direction (the partitioned area is referred to as a block)(step 701,702). The block is subdivided by a width w (=frame width Wf/number of multi pattern writings) in the direction orthogonal to the stage moving direction (the subdivided area is called a segment)(step 703). In FIG. 24, the number of multi pattern writings is 4. Next, a pattern writing time txy is obtained per segment. The process described above is implemented for all the frames, and as a result a pattern writing time map is created on the segment basis (step 705, 706).

Then, the pattern writing time T in the stripe is calculated on the block basis from the segments corresponding to the speed calculation target stripe (step 708). Referring to FIG. 22, a pattern writing time Ts1 of the block 1 in the stripe S is given by: Ts1=t12+t13+t14+T15. Similarly, for block 2, 3 and 4, pattern writing times Ts2, Ts3 and Ts4 are calculated by:

$$Ts2=t22+t23+t24+T25$$

$$Ts3=t32+t33+t34+T35$$

$$Ts4=t42+t43+t44+T45$$

After obtaining pattern writing times for all blocks for objective stripe (step 709, 710), a maximum time Tmax among them is obtained (step 711), whereby the stage speed Vs in the target stripe is calculated such as Vs=L/Tmax (formula (1))(step 712). The process described above is effected for all the stripes, thus obtaining the stage speed in each stripe (step 713, 714).

Generally, the pattern writing time Ts in the stripe can be expressed in approximation using a pattern writing time Tsj and a weight coefficient j such as:

$$Ts=jTsj$$

{block j in stripe}

The pattern writing time Ts can be calculated by Vs=L×n ?Ts (n: number of blocks). The weight coefficient j is obtained from a pattern density ratio and a shot density ratio within one block. FIG. 25 shows a relationship between j and Tsj.

In the method 9, the weight coefficient j in the block with the block pattern writing time Tsj being maximum is set to 1 (j=1) and in other cases set to 0 (j=0).

In general, the calculation of the pattern writing time on the block basis requires a long processing time. For instance, according to the method of calculating the pattern writing time per block by use of a circuit of the pattern writing apparatus, a time as long as the time required for writing the pattern is needed. Further, even in the case of obtaining the it based on a program for simulating the circuit operation, the number of shots and the settling times of the main- and sub-deflectors have to be obtained from the pattern constituting the pattern writing data. In this case also, the long processing time is needed.

According to the prior art method, the pattern writing time is calculated on the block basis with respect to all the stripes required for the multi pattern writings, and there is a necessity for determining the stage speed in the stripe by the formula (1). Hence, the processing time thereof is approximately N-times (corresponding to the number of multi-writings) as large as the single pattern writing. On the other hand, according to the method of the present invention, the single process of calculating the pattern writing time per block may suffice, the stage speed in stripe is calculated from the thus created pattern writing time map in the formula (1) by extracting an area corresponding to the concerned stripe from the pattern writing time map. This process can be executed in a time as short as being ignorable in a comparison with the time required for obtaining the block pattern writing time. That is, according to the present invention, the stage speed can be calculated in the processing time that is 1/N as small as the time by the prior art method. Accordingly, the time of the pre-processing needed for writing the pattern is remarkably reduced, and it follows that a pattern writing turn-around time is much reduced.

(Method 10)

A method 10 will be described with reference to FIGS. 26, 27, 28 and 29.

Figure 27:
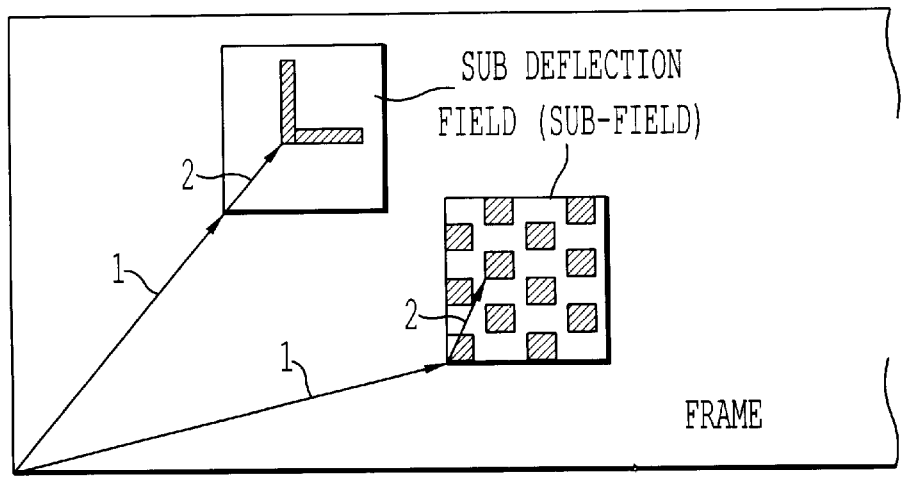
FIG. 27 is an explanatory diagram showing a relationship between a main-deflection beam and a sub-deflection beam.

A main-deflection settling circuit is a circuit for deflecting the main deflection beam on a sub-deflection field basis (see (1) in FIG. 27). A sub-deflection settling circuit is a circuit for deflecting a sub-deflection beam on the shot basis (see (2) in FIG. 27). A shot partitioning circuit is a circuit for partitioning the pattern into possible-of-writing-pattern shots (see FIG. 3). An irradiation quantity calculation circuit is a circuit for calculating a quantity of the charged beams irradiated on the shot basis.

Figure 28:
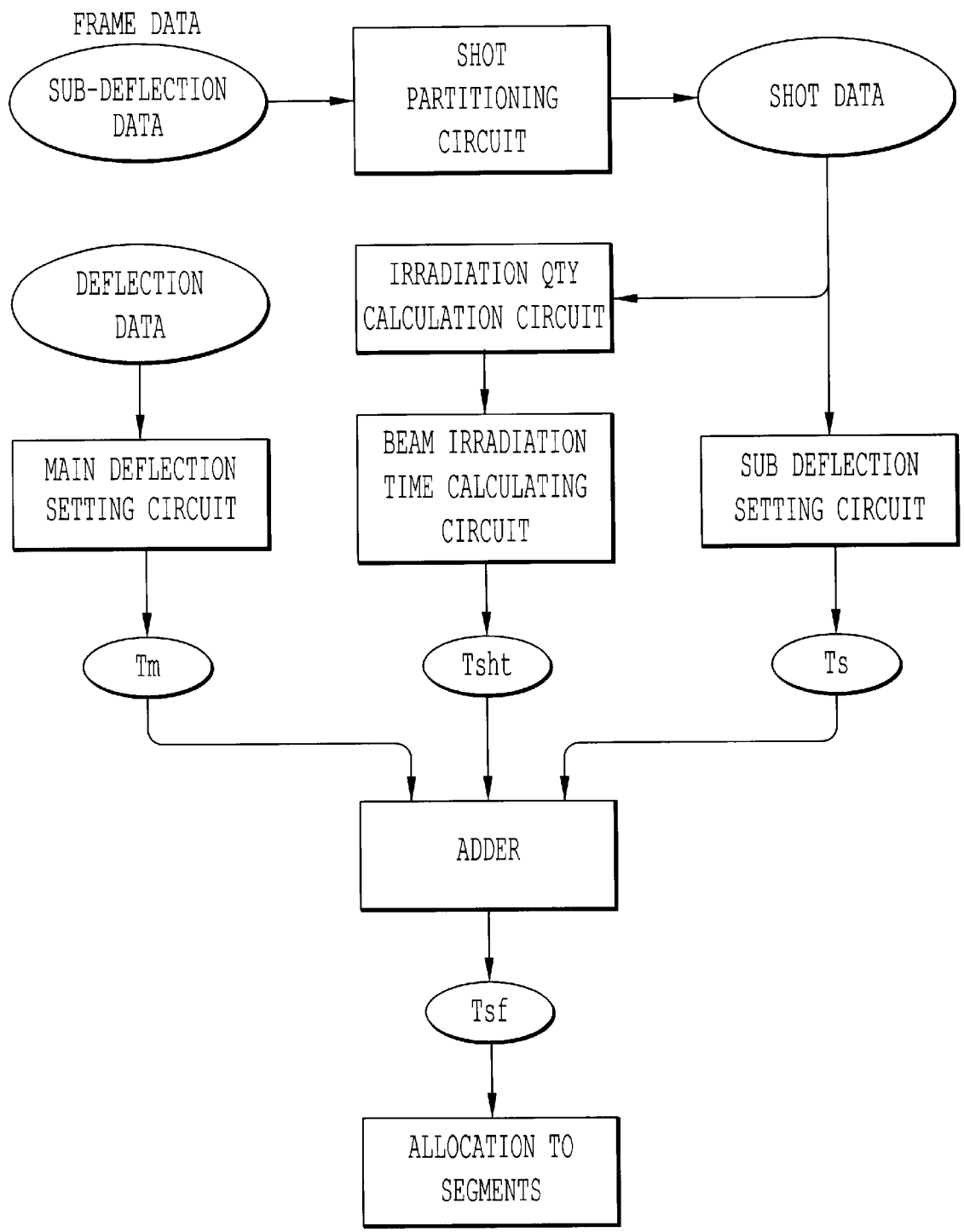
FIG. 28 is a flowchart showing an allocation process to the segments.

As shown in FIG. 28, the shot partitioning circuit partitions the whole pattern within the sub-field on the shot basis (shot data) in accordance with sub-deflection data (pattern configuration and positional data defined within the sub-field) of the frame data, and the sub-deflection settling circuit calculates a sub-deflection settling time (Ts) from positions or the number of the partitioned shots. Similarly, the irradiation quantity calculation circuit calculates a beam irradiation quantity from the shot data and, based on a result of this calculation, calculates a beam irradiation time, thereby calculating a time (Tsht) required for irradiating all the shots within the sub-field with the beams. Further, the main-deflection settling circuit calculates a main-deflection settling time (Tm) from the main-deflection data (positional data of the sub-field in the frame). The respective times obtained so far are added by an adder circuit, and a time tsf (=Ts+Tsht+Tm) needed for writing the pattern in one sub-field can be calculated. The value (the pattern writing time) with a much higher accuracy as obtained by use of the circuits of the pattern writing apparatus.

Figure 29:
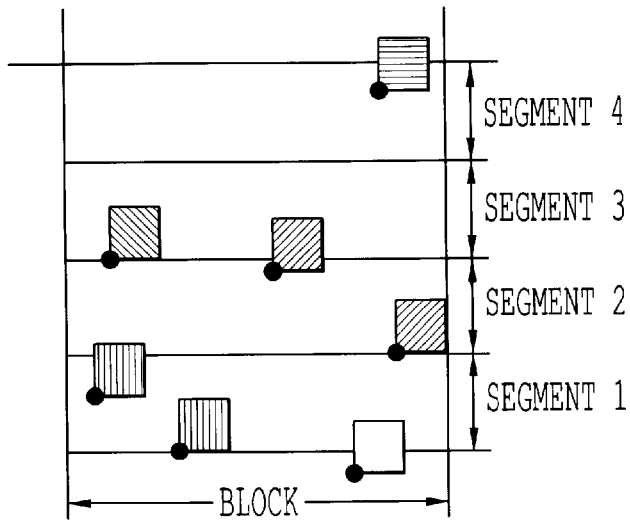
FIG. 29 is an explanatory diagram showing which segment a sub-field is added to depending on a sub-field position.

The thus obtained pattern writing time tsf must be allocated to the segments. As shown in FIG. 29, the reference for the allocation is set to a sub-field originating point, and the calculation is made by adding the sub-field to the segment including the originating point. The pattern writing time is obtained on a sub-field basis and allocated to the segments, whereby the processing can be done at a high speed. If effected on the shot basis, it must be judged which segment is corresponded to per shot, and a processing efficiency is lower than when judged on the sub-field basis.

The processes described above are executed for the respective frames, and a pattern writing time txy on the segment basis is calculated.

Furthermore, the pattern writing time txy may also be obtained from a sum of the operating time of the circuit which is obtained by the program for simulating the operations of the above-mentioned circuits, and of the time need for the beam irradiation for the shot.

(Method 11)

Figure 30:
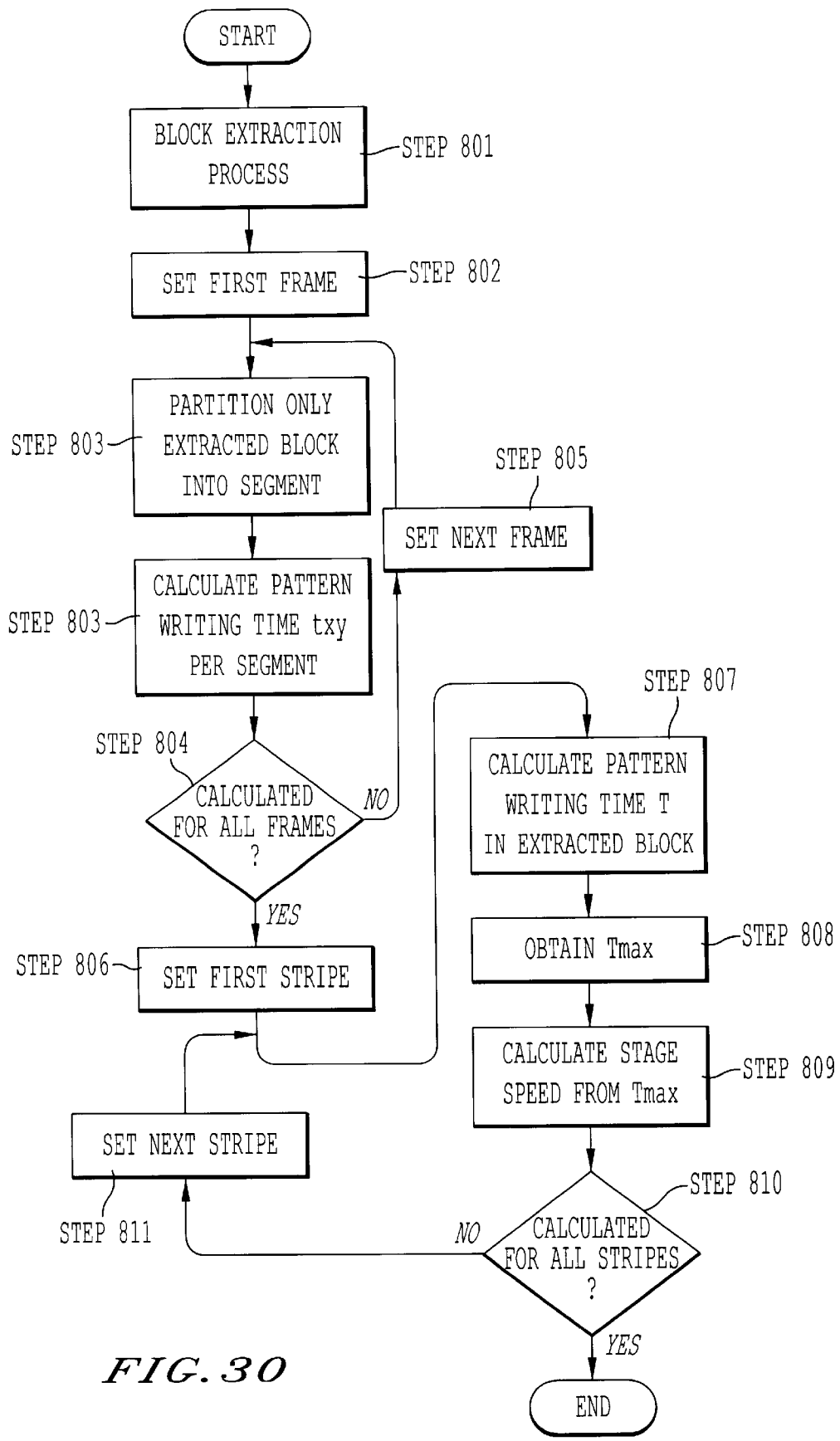
FIG. 30 is a flowchart showing a still further method relative to the speed determining process.
Figure 31:
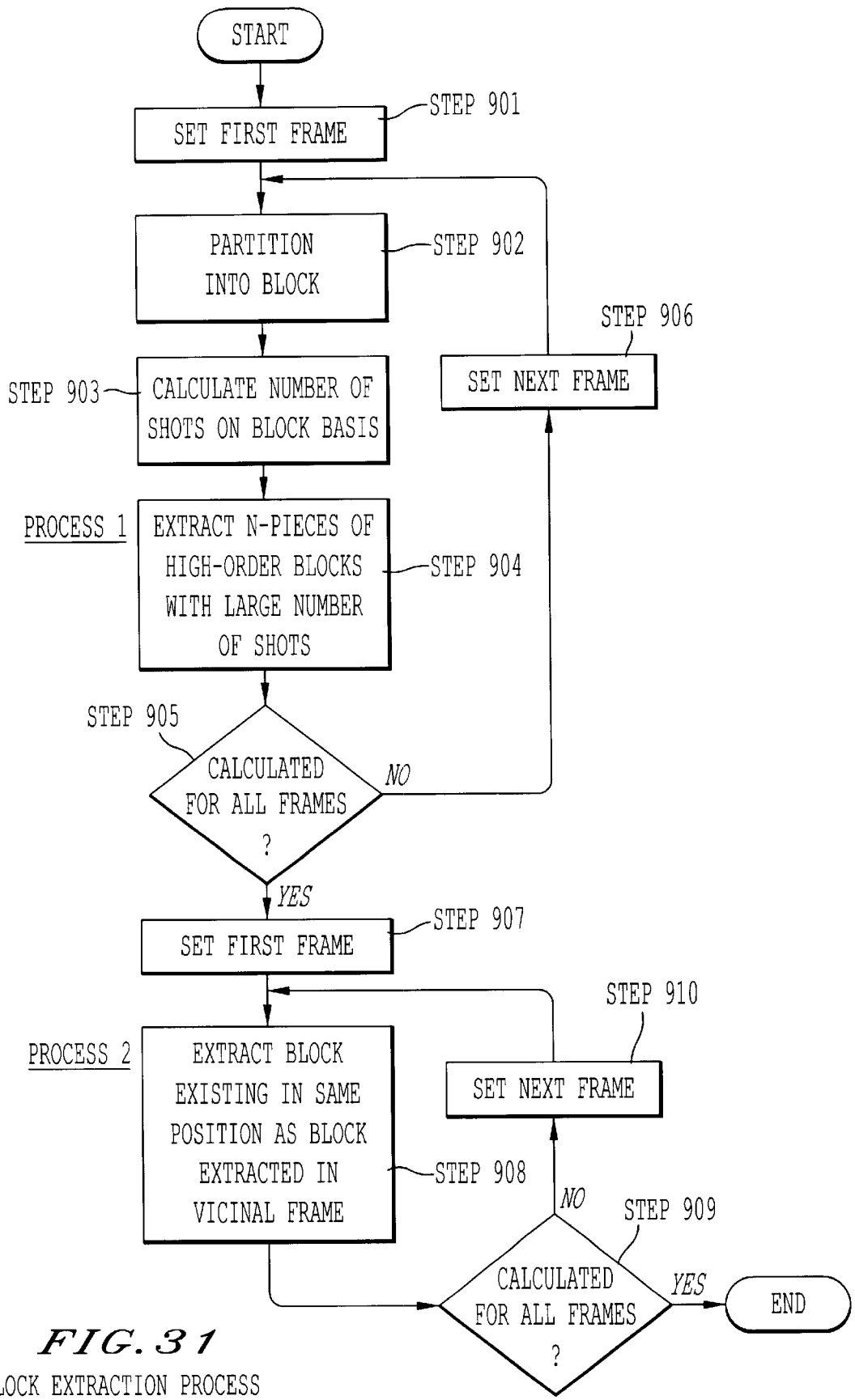
FIG. 31 is a flowchart showing a yet further method relative to the speed determining process.
Figure 32:
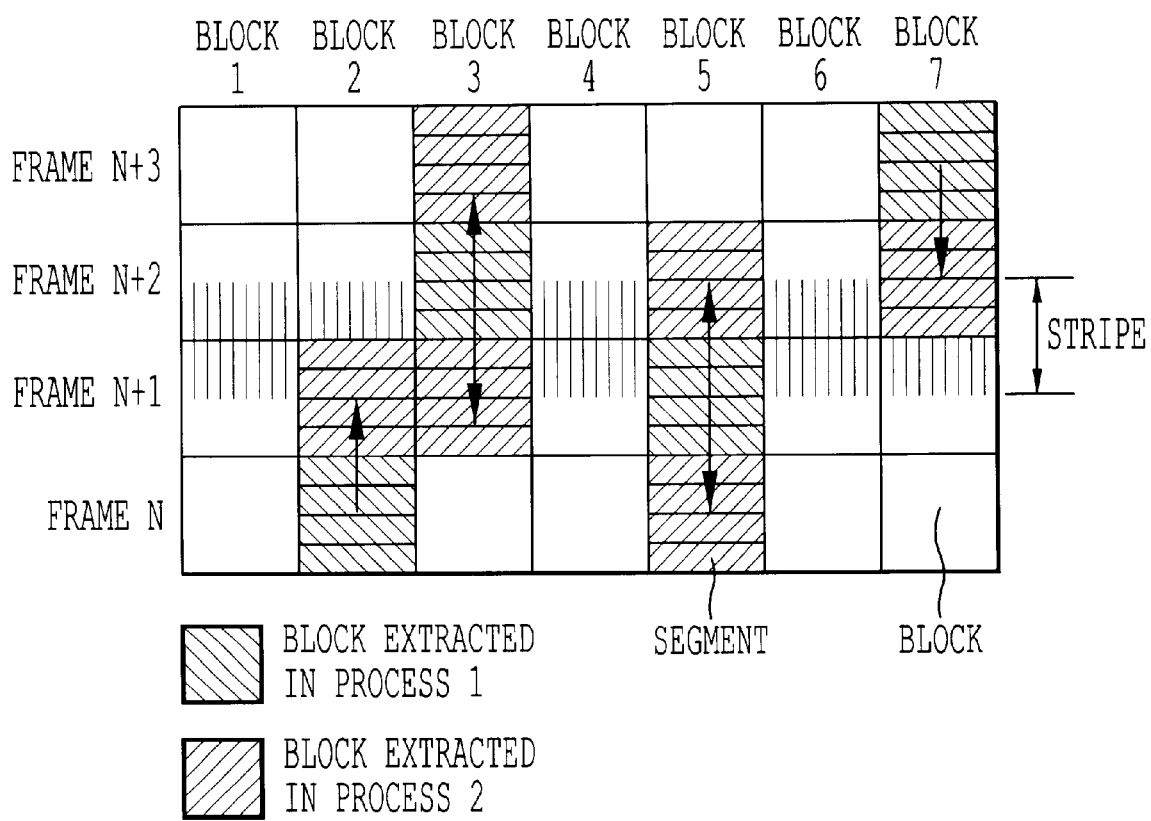
FIG. 32 is an explanatory diagram showing a process by the method shown in FIG. 31.
Figure 33:
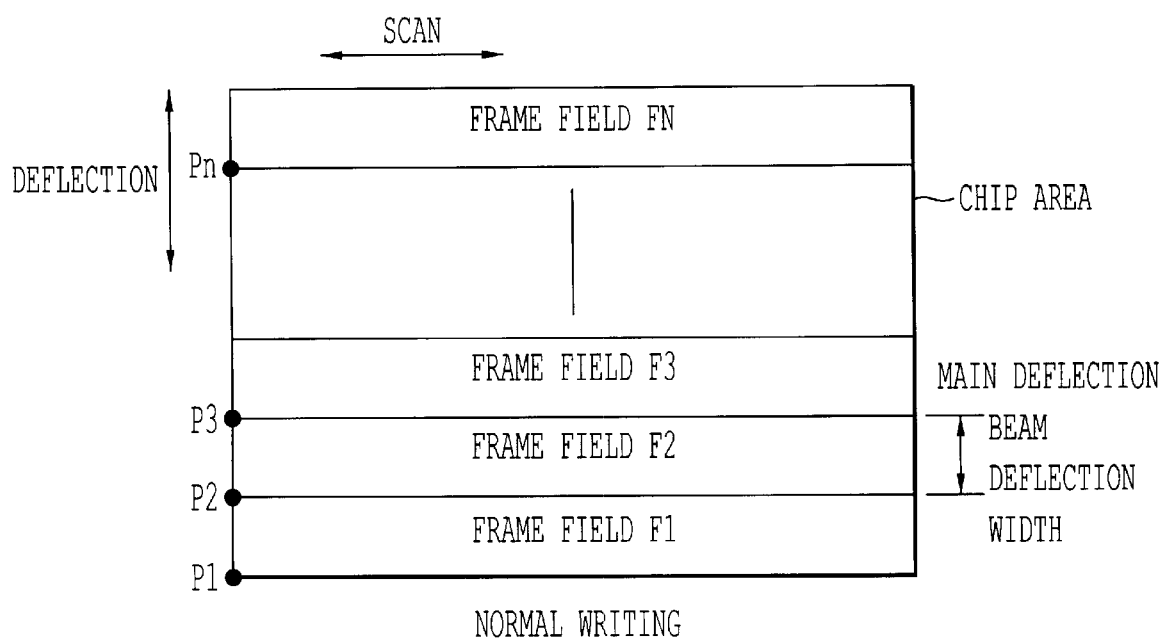
FIG. 33 is a diagram showing a relationship between a pattern writing target chip area and a frame field when using the main-deflection beam in the normal pattern writing.
Figure 34:
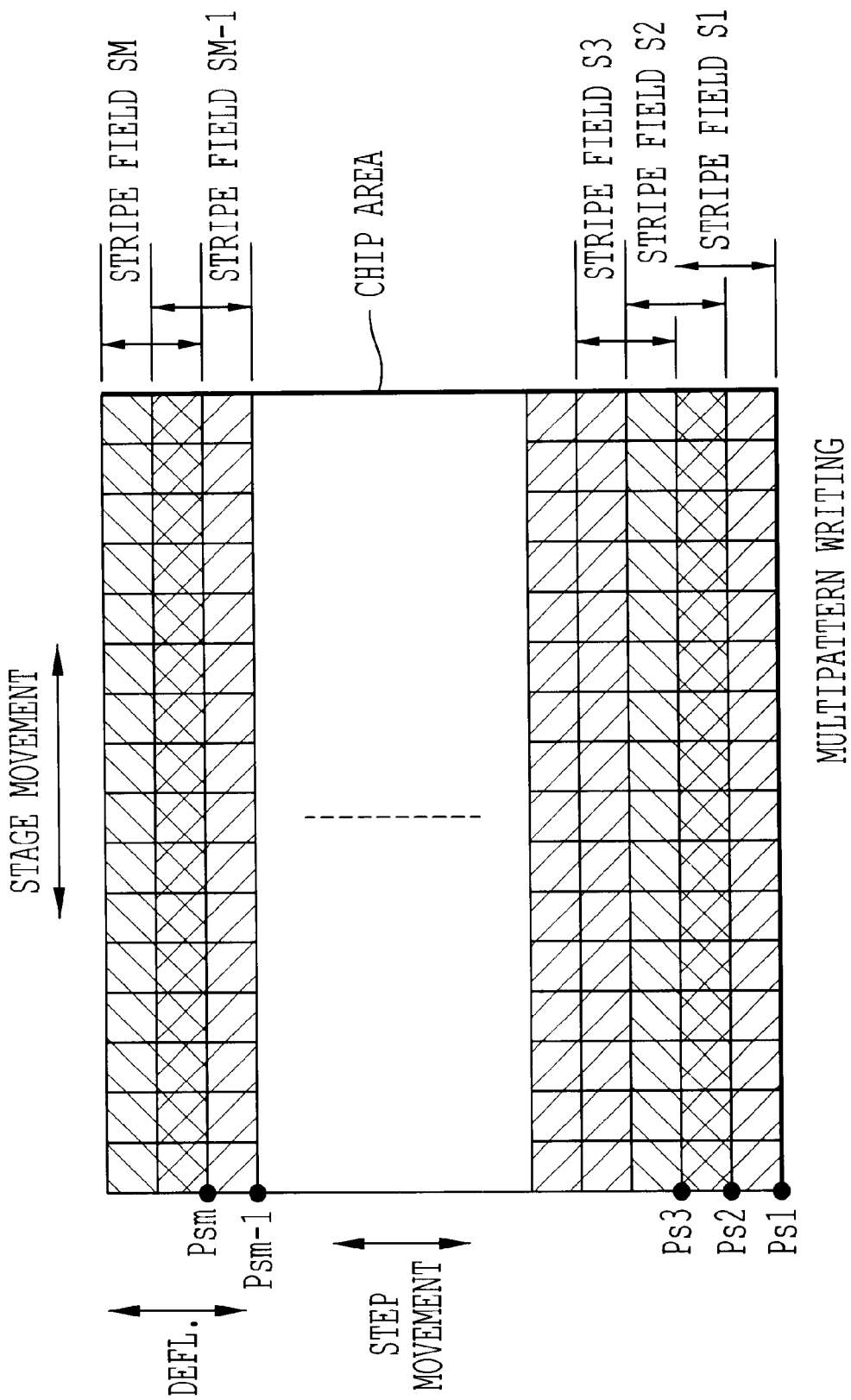
FIG. 34 is a diagram showing a relationship between the pattern writing target chip area and the stripe field in the multi pattern writings.
Figure 35:
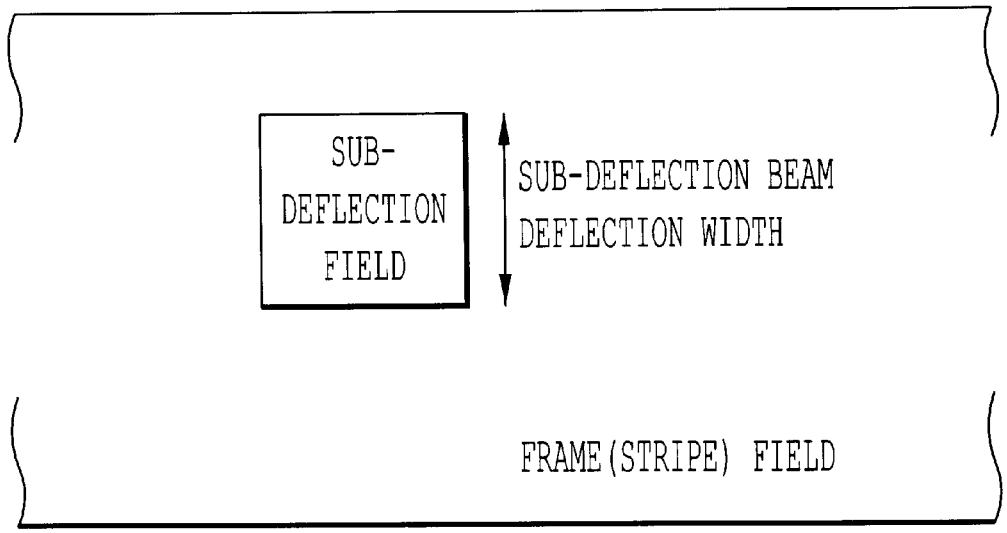
FIG. 35 is a diagram showing a relationship the frame field or the stripe field and a sub-deflection field.

The calculation of the pattern writing time txy in the segment is explained referring to FIGS. 30, 31 and 32.

To begin with, the number of shots is calculated per block of the frame. As shown in FIG. 32, N-pieces of high-order blocks each having a large number of shots among the numbers of shots of all the blocks on the frame basis, are extracted (process 1)(step 903). This process is effected for all the frames (step 905, 906). Next, the blocks disposed in the same positions as the extracted blocks in the frames vicinal thereto, are extracted per frame (process 2)(step 908). The pattern writing time txy in the segment shown in the methods 3 and 4 is obtained with respect to the blocks extracted in the processes 1 and 2.

Only the blocks (of which the pattern writing time is presumed long) exhibiting the high pattern density are extracted and processed with the number of shots being a judgement criterion, thereby attaining the high-speed processing.

FIG. 32 shows an example in which the number of extracted blocks in the process 1 is 1, and the number of reference vicinal frames in the process 2 is 2. At first, as shown in FIG. 22, the frame is partitioned by the width L in the stage moving direction (the partitioned area is called a block). The pattern writing time T is calculated on this block basis. This process is executed for all the frames and, as a result, the pattern writing time map is created per block.

Next, the blocks in a region corresponding to a speed calculation target stripe are extracted. There is obtained a total sum T of pattern writing times ts of the region (hatched in FIG. 22) relative to the stripe defined by the extracted blocks. The target stripe speed Vs is given from the stripe length S1 and the pattern writing time T, such as Vs=S1/T.

Further, the calculation of the pattern writing time. t on the block basis may also involve the use of the method disclosed in Japanese Patent Application Laid-Open No.4-61221.

According to the method described above, the single process of calculating the pattern writing time may suffice irrespective of the number of the multi pattern writings, and the pattern writing time per stripe can be calculated at the high speed.

According to the present invention which has been discussed so far in details, when determining the stage speed in the multi pattern writings by the charged beam pattern writing apparatus, the in-the-stripe stage speed optimal enough to cause not error in the pattern writing can be calculated at the high speed, hereby the throughput of the whole charged beam exposure system can be enhanced.

Further, the extraction process is carried out before the pattern writing process, and the pattern writing process may also be implemented by giving the data of the block which requires the pattern writing time txy on the segment basis when in the pattern writing process.

The present invention, which has been discussed so far by way of the methods, is not limited to these methods and may be modified within the range of the present invention without deviating from the gist of the present invention. For example, the construction of the electron beam pattern writing apparatus is not confined to that shown in FIG. 1 but may be properly varied. Further, in the methods discussed above, the two main- and sub-stage system electron beam pattern writing. apparatus has been exemplified, however, a multi-stage deflection system may also be adopted, and the apparatus can be applied to the charged beams excluding the electron beams.

What is claimed is:

1. A charged beam exposure system comprising:
   a charged beam source;
   a movable stage on which a specimen is supported, said system writing a pattern by moving said stage at a fixed speed for a frame field, which is a unit of writing determined by a deflection width of a main deflected beam, and said system irradiating the charged beam only for frame fields that are to be exposed; and
   a stage moving control unit configured to determine, before frame field writing, said fixed speed for a frame field by:
      calculating a segment writing time for each of a plurality of segments partitioned from said frame field in a stage moving direction,
      calculating a block writing time for each of a plurality of blocks of said segment, each block being a consecutive series of said segments and having at least one segment common to another block such that adjacent blocks overlap one another, and
      determining a longest block writing time from the calculated writing times for the plurality of blocks and setting said fixed speed as the longest block writing time.

2. The charged beam exposure system according to claim 1, wherein a deflection width of said main deflected beam is a width of at least one of said blocks.

3. The charged beam exposure system according to claim 1, wherein a pitch between said blocks is equal to the width of the segment.

4. A charged beam exposure system comprising:
   a charged beam source;
   a movable stage on which a specimen is supported, said system writing a pattern by moving said stage at a fixed speed for a stripe field which is determined by a deflection width of a main deflected beam and by a number of multi pass writing, and said system irradiating the beam only for stripe fields that are to be exposed; and
   a stage moving control unit configured to determine, before stripe field writing, said fixed speed for a stripe field by:
      calculating a segment writing time for each of a plurality of segments partitioned from said stripe field in a stage moving direction,
      calculating a block writing time for each of a plurality of blocks of said segment, each block being a consecutive series of said segments and having at least one segment common to another block such that adjacent blocks overlap one another, and
      determining a longest block writing time from the calculated writing times for the plurality of blocks and setting said fixed speed as the longest block writing time.

5. The charged beam exposure system according to claim 4, wherein a deflection width of said main deflected beam is a width of at least one of said block.

6. The charged beam exposure system according to claim 5, wherein a pitch between said blocks is equal to the width of the segment.

7. A charged beam exposure system comprising:
   a charged beam source;
   a movable stage on which a specimen is supported, said system writing a pattern by moving said stage at a fixed speed for a stripe field which is determined by a deflection width of a main deflected beam and by a number of multi pass writing, and said system irradiating the charged beam only for stripe fields that are to be exposed;
   a stage moving control unit configured to determine, before stripe field writing, said fixed speed for a stripe field by:
      calculating a segment writing time for each of a plurality of segments partitioned from said frame field in a stage moving direction,
      calculating a block writing time for each of a plurality of blocks of said segment, each block being a consecutive series of said segments and having at least one segment common to another block such that adjacent blocks overlap one another,
      extracting blocks that overlap said stripe fields, and
      determining a longest block writing time from the calculated writing times for the plurality of blocks and setting said fixed speed as the longest block writing time.

8. The charged beam exposure system according to claim 7, wherein a deflection width of said main deflected beam is a width of at least one of said block.

9. The charged beam exposure system according to claim 7, wherein a pitch between said blocks is equal to the width of the segment.

* * * * *